United States Patent
Sasajima et al.

(10) Patent No.: US 10,066,294 B2
(45) Date of Patent: Sep. 4, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Ryota Sasajima, Toyama (JP);
Shintaro Kogura, Toyama (JP);
Masayoshi Minami, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 220 days.

(21) Appl. No.: 15/053,489

(22) Filed: Feb. 25, 2016

(65) Prior Publication Data

US 2016/0244875 A1 Aug. 25, 2016

(30) Foreign Application Priority Data

Feb. 25, 2015 (JP) ................. 2015-035742

(51) Int. Cl.
*H01L 21/311* (2006.01)
*C23C 16/44* (2006.01)
(Continued)

(52) U.S. Cl.
CPC .......... *C23C 16/4405* (2013.01); *C23C 16/30* (2013.01); *C23C 16/45527* (2013.01);
(Continued)

(58) Field of Classification Search
CPC .......... H01L 21/0228; H01L 21/02126; C23C 16/30; C23C 16/45527; C23C 16/4405; C23C 16/45546
(Continued)

(56) References Cited

U.S. PATENT DOCUMENTS

2002/0086530 A1 7/2002 Kim et al.
2008/0132083 A1 6/2008 Matsuura
(Continued)

FOREIGN PATENT DOCUMENTS

CN 1172743 C 10/2004
CN 101192534 A 6/2008
(Continued)

OTHER PUBLICATIONS

Taiwanese Office Action for Application No. 105103113 dated Apr. 19, 2017.
(Continued)

*Primary Examiner* — Binh X Tran
(74) *Attorney, Agent, or Firm* — Volpe and Koenig, P.C.

(57) ABSTRACT

A method of manufacturing a semiconductor device includes forming a film on a substrate by performing a cycle a predetermined number of times. The cycle includes non-simultaneously performing: supplying a precursor gas to the substrate in a process chamber through a first nozzle; supplying an oxygen-containing gas to the substrate in the process chamber through a second nozzle made of quartz and differing from the first nozzle; and supplying a hydrogen-containing gas to the substrate in the process chamber through the second nozzle. The method further includes, prior to performing the act of forming the film, etching a surface of the second nozzle to a depth which falls within a range of 15 μm or more and 30 μm or less from the surface of the second nozzle.

15 Claims, 13 Drawing Sheets

(51) Int. Cl.
  *H01L 21/02*    (2006.01)
  *C23C 16/30*    (2006.01)
  *C23C 16/455*   (2006.01)

(52) U.S. Cl.
  CPC .. *C23C 16/45546* (2013.01); *C23C 16/45578* (2013.01); *H01L 21/0228* (2013.01); *H01L 21/02126* (2013.01)

(58) Field of Classification Search
  USPC .................... 438/703, 723, 743, 745, 756
  See application file for complete search history.

(56) References Cited

U.S. PATENT DOCUMENTS

| | | | | |
|---|---|---|---|---|
| 2009/0149032 A1* | 6/2009 | Kameda | ............... | C23C 16/4405 438/778 |
| 2013/0102161 A1* | 4/2013 | Asai | ............... | C23C 16/4405 438/791 |
| 2013/0260566 A1* | 10/2013 | Yamazaki | ............... | H01L 21/306 438/706 |
| 2014/0080314 A1 | 3/2014 | Sasajima et al. | | |
| 2014/0251203 A1* | 9/2014 | Suzuki | ............... | C30B 25/16 117/90 |
| 2015/0000695 A1* | 1/2015 | Noda | ............... | C23C 16/4405 134/1.1 |
| 2015/0011091 A1* | 1/2015 | Takenaga | ............... | C23C 16/045 438/703 |
| 2015/0232986 A1* | 8/2015 | Kameda | ............... | C23C 16/4405 438/758 |

FOREIGN PATENT DOCUMENTS

JP    2006-004985 A    1/2006
TW    201413035 A     4/2014

OTHER PUBLICATIONS

Taiwanese Office Action for Application No. 10620405580 dated Apr. 19, 2017.

* cited by examiner

|  | Etching | Number of particles | | |
|---|---|---|---|---|
|  |  | TOP | CEN | BTM |
| Sample 4 | Not performed | 1261 | 396 | 248 |
| Sample 5 | Performed | 36 | 32 | 18 |

US 10,066,294 B2

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2015-035742, filed on Feb. 25, 2015, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film on a substrate is often carried out by non-simultaneously supplying a precursor gas, an oxygen (O)-containing gas and a hydrogen (H)-containing gas to the substrate existing within a process chamber.

However, the present inventors have revealed through extensive studies that, if an O-containing gas or a H-containing gas is supplied into a process chamber, there is a case where a large amount of particles are generated in the process chamber.

SUMMARY

The present disclosure provides some embodiments of a technique capable of suppressing generation of particles when forming a film on a substrate.

According to one embodiment of the present disclosure, there is provided a technique, including: forming a film on a substrate by performing a cycle a predetermined number of times, the cycle including non-simultaneously performing:

supplying a precursor gas to the substrate in a process chamber through a first nozzle;

supplying an oxygen-containing gas to the substrate in the process chamber through a second nozzle made of quartz and differing from the first nozzle; and supplying a hydrogen-containing gas to the substrate in the process chamber through the second nozzle, wherein the technique further includes: prior to performing the act of forming the film, etching a surface of the second nozzle to a depth which falls within a range of 15 μm or more and 30 μm or less from the surface of the second nozzle.

DETAILED DESCRIPTION

First Embodiment

One embodiment of the present disclosure will now be described with reference to FIGS. 1 to 3.

(1) Configuration of Substrate Processing Apparatus

Figure 1:
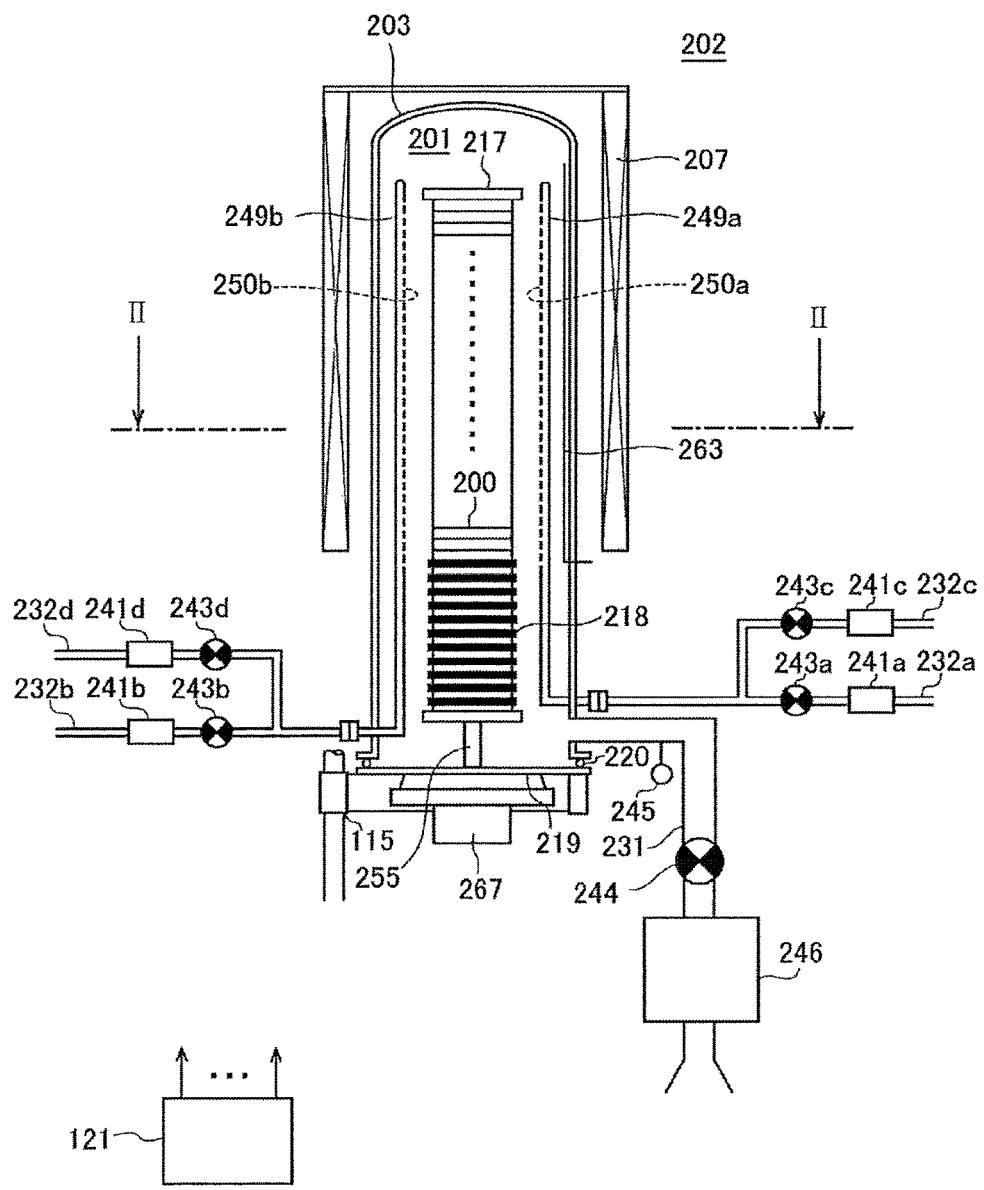
FIG. 1 is a schematic configuration view of a vertical processing furnace of a substrate processing apparatus suitably used in one embodiment of the present disclosure, in which a portion of the processing furnace is shown in a vertical cross section.
Figure 2:
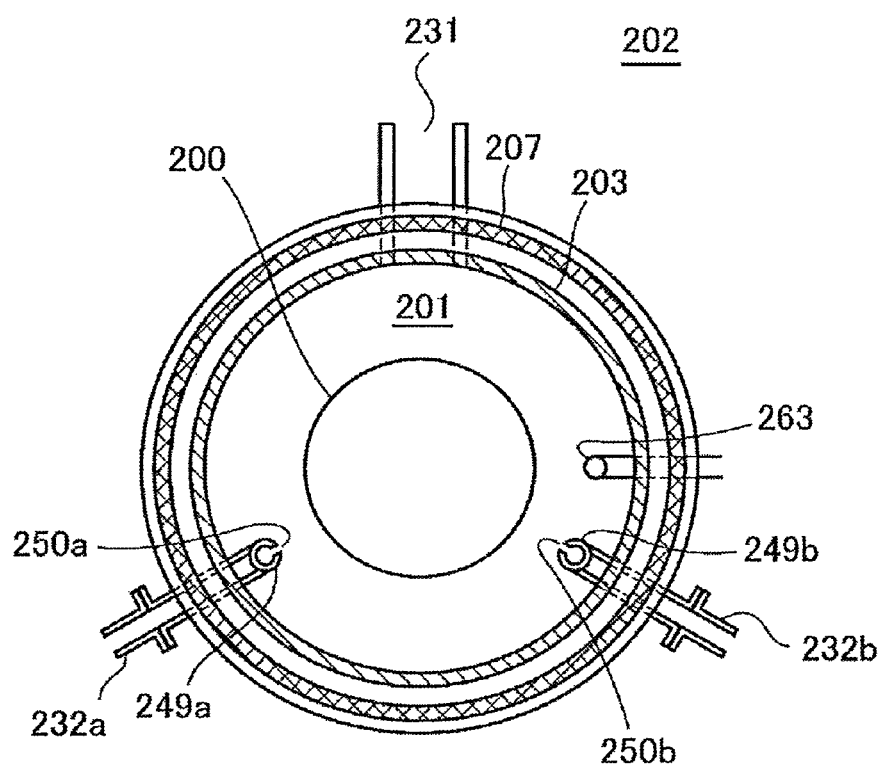
FIG. 2 is a schematic configuration view of the vertical processing furnace of the substrate processing apparatus suitably used in one embodiment of the present disclosure, in which a portion of the processing furnace is shown in a cross section taken along line II-II in FIG. 1.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 constituting a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process is formed in a hollow cylindrical portion of the reaction tube 203. The process chamber 201 is configured to accommodate a plurality of wafers 200 as substrates. The wafers 200 are horizontally stacked at multiple stages along a vertical direction in a boat 217 which will be described later.

A nozzle 249a as a first nozzle and a nozzle 249b as a second nozzle are installed in the process chamber 201 so as to penetrate through a lower portion of a sidewall of the reaction tube 203. The nozzles 249a and 249b are respectively made of quartz. Gas supply pipes 232a and 232b are respectively connected to the nozzles 249a and 249b. In this way, the two nozzles 249a and 249b and the two gas supply pipes 232a and 232b are installed in the reaction tube 203 and are capable of supplying plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed in a lower portion of the reaction tube 203 rather than in the manifold. A furnace opening portion of the processing furnace 202 may be made of metal and the nozzles or the like may be installed in the metal-made furnace opening portion.

Mass flow controllers (MFC) 241a and 241b, which are flow rate controllers (flow rate control parts), and valves 243a and 243b, which are opening/closing valves, are installed in the gas supply pipes 232a and 232b sequentially from the corresponding upstream sides, respectively. Gas supply pipes 232c and 232d, which supply an inert gas, are respectively connected to the gas supply pipes 232a and 232b at the downstream side of the valves 243a and 243b. MFCs 241c and 241d, which are flow rate controllers (flow rate control parts), and valves 243c and 243d, which are opening/closing valves, are installed in the gas supply pipes 232c and 232d sequentially from the corresponding upstream sides, respectively.

The nozzles 249a and 249b are respectively connected to front end portions of the gas supply pipes 232a and 232b. As shown in FIG. 2, the nozzles 249a and 249b are disposed in an annular space between the inner wall of the reaction tube 203 and the wafers 200 such that the nozzles 249a and 249b extend upward along an arrangement direction of the wafers 200 from a lower portion of the inner wall of the reaction tube 203 to an upper portion thereof. Specifically, the nozzles 249a and 249b are installed in a region horizontally surrounding a wafer arrangement region in which the wafers 200 are arranged at a lateral side of the wafer arrangement region, along the wafer arrangement region. That is to say, the nozzles 249a and 249b are respectively installed in a perpendicular relationship with the surfaces (flat surfaces) of the wafers 200 at a lateral side of the end portions (peripheral edge portions) of the wafers 200, which are carried into the process chamber 201. Each of the nozzles 249a and 249b is configured as an L-shaped nozzle. A horizontal portion of each of the nozzles 249a and 249b is installed to penetrate a lower sidewall of the reaction tube 203. A vertical portion of each of the nozzles 249a and 249b is installed to extend upward at least from one end portion of the wafer arrangement region toward the other end portion thereof. A plurality of gas supply holes 250a and 250b for supplying gas is respectively formed on the side surfaces of its nozzles 249a and 249b. Each of the gas supply holes 250a and 250b is opened toward the center of the reaction tube 203 to allow the gas to be supplied toward the wafers 200. The gas supply holes 250a and 250b may be formed in a plural number between the lower portion of the reaction tube 203 and the upper portion thereof. The respective gas supply holes 250a and 250b may be formed to have the same aperture area at a same aperture pitch.

As described above, in the present embodiment, a gas is transferred through the nozzles 249a and 249b, which are disposed in the vertically-elongated annular space, i.e., a cylindrical space, defined by the inner surface of the side wall of the reaction tube 203 and the end portions (peripheral edge portions) of the stacked wafers 200. The gas is initially injected into the reaction tube 203, near the wafers 200, through the gas supply holes 250a and 250b formed in the nozzles 249a and 249b. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve uniformity in the thickness of a thin film formed on each of the wafers 200. In addition, the gas flowing on the surfaces of the wafers 200 after reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A precursor gas, for example, a halosilane precursor gas including Si as a predetermined element and a halogen element, is supplied from the gas supply pipe 232a into the process chamber 201 via the MFC 241a, the valve 243a and the nozzle 249a.

The halosilane precursor gas refers to a gaseous halosilane precursor, for example, a gas obtained by vaporizing a halosilane precursor which remains in a liquid state under room temperature and atmospheric pressure, or a halosilane precursor which remains in a gas state under room temperature and atmospheric pressure. The halosilane precursor refers to a silane precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. The halosilane precursor may be said to be one kind of halide. When the term "precursor" is used herein, it may refer to "a liquid precursor staying in a liquid state," "a precursor gas staying in a gaseous state," or both.

Figure 7A:
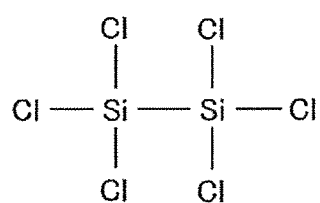
FIG. 7A is a diagram illustrating a chemical structural formula of HCDS.
Figure 7B:
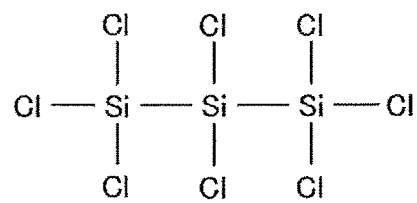
FIG. 7B is a diagram illustrating a chemical structural formula of OCTS.

As the halosilane precursor gas, it may be possible to use, e.g., a C-free precursor gas containing Si and Cl, namely an inorganic chlorosilane precursor gas. As the inorganic chlorosilane precursor gas, it may be possible to use, e.g., a hexachlorodisilane ($Si_2Cl_6$, abbreviation: HCDS) gas or an octachlorotrisilane ($Si_3Cl_8$, abbreviation: OCTS) gas. FIG. 7A illustrates a chemical structural formula of HCDS, and FIG. 7B illustrates a chemical structural formula of OCTS. These gases may be referred to as precursor gases which contain at least two Si atoms in one molecule and further Cl, and which have a Si—Si bond. These gases act as Si sources in a film forming process which will be described later.

Figure 8A:
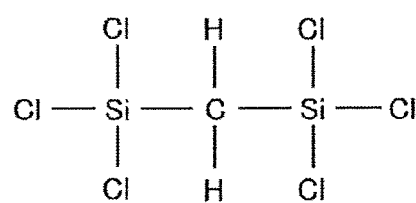
FIG. 8A is a diagram illustrating a chemical structural formula of BTCSM.
Figure 8B:
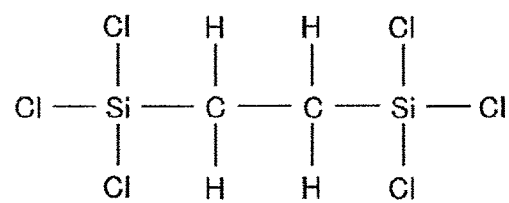
FIG. 8B is a diagram illustrating a chemical structural formula of BTCSE.

Furthermore, as the halosilane precursor gas, it may be possible to use, e.g., a precursor gas containing Si, Cl and an alkylene group and having a Si—C bond, namely an alkylene chlorosilane precursor gas which is an organic chlorosilane precursor gas. The alkylene group includes a methylene group, an ethylene group, a propylene group, a butylene group, and so forth. The alkylene chlorosilane precursor gas may be referred to as an alkylene halosilane precursor gas. As the alkylene chlorosilane precursor gas, it may be possible to use, e.g., a bis(trichlorosilyl)methane (($SiCl_3)_2CH_2$, abbreviation: BTCSM) gas and an ethylene bis(trichlorosilane) gas, namely a 1,2-bis(trichlorosilyl)ethane (($SiCl_3)_2C_2H_4$, abbreviation: BTCSE) gas. FIG. 8A illustrates a chemical structural formula of BTCSM, and FIG. 8B illustrates a chemical structural formula of BTCSE. These gases may be referred to as precursor gases which contain at least two Si atoms in one molecule and further C and Cl, and which have a Si—C bond. These gases act as Si sources and C sources in a film forming process which will be described later.

Figure 9A:
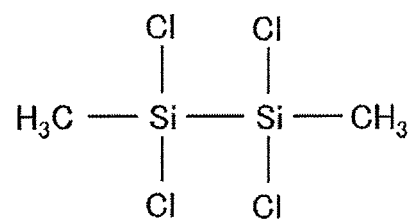
FIG. 9A is a diagram illustrating a chemical structural formula of TCDMDS.
Figure 9B:
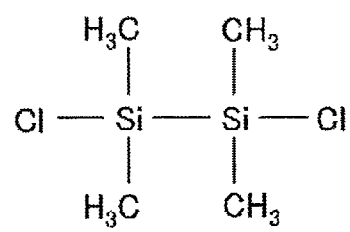
FIG. 9B is a diagram illustrating a chemical structural formula of DCTMDS.
Figure 9C:
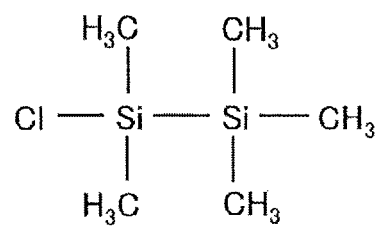
FIG. 9C is a diagram illustrating a chemical structural formula of MCP-MDS.

Moreover, as the halosilane precursor gas, it may be possible to use, e.g., a precursor gas containing Si, Cl and an alkyl group and having a Si—C bond, namely an alkyl chlorosilane precursor gas which is an organic chlorosilane precursor gas. The alkyl group includes a methyl group, an ethyl group, a propyl group, a butyl group, and so forth. The alkyl chlorosilane precursor gas may be referred to as an alkyl halosilane precursor gas. As the alkyl chlorosilane precursor gas, it may be possible to use, e.g., a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, a 1-monochloro-1,1,2,2,2-pentamethyldisilane (($CH_3)_5Si_2Cl$, abbreviation: MCPMDS) gas, or the like. FIG. 9A illustrates a chemical structural formula of TCDMDS, FIG. 9B illustrates a chemical structural formula of DCTMDS, and FIG. 9C illustrates a chemical structural formula of MCPMDS. These gases may be referred to as precursor gases which contain at least two Si atoms in one molecule and further C and Cl, and which have a Si—C bond. These gases further contain a Si—Si bond. These gases act as Si sources and C sources in a film forming process which will be described later.

In the case of using a liquid precursor, such as HCDS, BTCSM, TCDMDS or the like, which stays in a liquid state under room temperature and atmospheric pressure, the liquid precursor is vaporized by a vaporization system such as a vaporizer or a bubbler and is supplied as a precursor gas (a HCDS gas, a BTCSM gas, a TCDMDS gas, etc.).

A reaction gas differing in chemical structure (molecular structure) from the precursor gas, for example, a carbon (C)-containing gas, is supplied from the gas supply pipe 232a into the process chamber 201 via the MFC 241a, the valve 243a and the nozzle 249a. As the C-containing gas, it may be possible to use, e.g., a hydrocarbon-based gas. The hydrocarbon-based gas may be referred to as a substance consisting of only two elements C and H. The hydrocarbon-based gas acts as a C source in a film forming process which will be described later. As the hydrocarbon-based gas, it may be possible to use, e.g., a propylene ($C_3H_6$) gas.

A reaction gas differing in chemical structure from the precursor gas, for example, an oxygen (O)-containing gas, is supplied from the gas supply pipe 232b into the process chamber 201 via the MFC 241b, the valve 243b and the nozzle 249b. The O-containing gas acts as an oxidizing gas, namely an O source, in a film forming process which will be described later. As the O-containing gas, it may be possible to use, e.g., an oxygen ($O_2$) gas.

A reaction gas differing in chemical structure from the precursor gas, for example, a hydrogen (H)-containing gas, is supplied from the gas supply pipe 232b into the process chamber 201 via the MFC 241b, the valve 243b and the nozzle 249b.

As the H-containing gas, it may be possible to use, e.g., a hydrogen nitride-based gas which is a gas containing nitrogen (N) and hydrogen (H). The hydrogen nitride-based gas may be referred to as a substance consisting of only two elements N and H or may be referred to as a nitrogen (N)-containing gas. The nitrogen (N)-containing gas acts as a nitriding gas, namely an N source in a film forming process which will be described later. As the hydrogen nitride-based gas, it may be possible to use, e.g., an ammonia ($NH_3$) gas.

Furthermore, as the H-containing gas, it may also be possible to use, e.g., an amine-based gas which is a gas containing N, C and H. The amine-based gas may be referred to as a substance consisting of only three elements C, N and H or may be referred to as an N- and C-containing gas. The amine-based gas acts as an N source and a C source in a film forming process which will be described later. As the amine-based gas, it may be possible to use, e.g., a triethylamine (($C_2H_5)_3N$, abbreviation: TEA) gas. In the case of using amine, such as TEA or the like, which stays in a liquid state under room temperature and atmospheric pressure, the liquid amine is vaporized by a vaporization system such as a vaporizer or a bubbler and then is supplied as an amine-based gas (a TEA gas).

Moreover, as the H-containing gas, it may also be possible to use, e.g., an organic hydrazine-based gas which is a gas containing N, C and H. The organic hydrazine-based gas may be referred to as a substance consisting of only three elements N, C and H or may be referred to as an N- and C-containing gas. The organic hydrazine-based gas acts as an N source and a C source in a film forming process which will be described later. As the organic hydrazine-based gas, it may be possible to use, e.g., a trimethylhydrazine (($CH_3)_2N_2(CH_3)H$, abbreviation: TMH) gas. In the case of using amine, such as TMH or the like, which stays in a liquid state under room temperature and atmospheric pressure, the liquid amine is vaporized by a vaporization system such as a vaporizer or a bubbler and then is supplied as an organic hydrazine-based gas (a TMH gas).

In addition, as the H-containing gas, it may be possible to use, e.g., an N- or C-free gas such as a hydrogen ($H_2$) gas, a deuterium ($D_2$) gas or the like.

In addition to the aforementioned film forming gases, an etching gas, for example, a fluorine-based gas, is supplied from the gas supply pipes 232a and 232b into the process chamber 201 via the MFCs 241a and 241b, the valves 243a and 243b, and the nozzles 249a and 249b. As the fluorine-based gas, it may be possible to use, for example, a fluorine ($F_2$) gas.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b, and the nozzles 249a and 249b.

In the case of supplying the precursor gas from the gas supply pipe 232a, a precursor gas supply system is mainly configured by the gas supply pipe 232a, the MFC 241a, and the valve 243a. The precursor gas supply system may also include the nozzle 249a. The precursor gas supply system may be referred to as a precursor supply system. In the case of supplying a halosilane precursor gas from the gas supply pipe 232a, the precursor gas supply system may be referred to as a halosilane precursor gas supply system or a halosilane precursor supply system.

In the case of supplying the C-containing gas from the gas supply pipe 232a, a C-containing gas supply system is mainly configured by the gas supply pipe 232a, the MFC 241a, and the valve 243a. The C-containing gas supply system may also include the nozzle 249a. In the case of supplying a hydrocarbon-based gas from the gas supply pipe 232a, the C-containing gas supply system may be referred to as a hydrocarbon-based gas supply system or a hydrocarbon supply system.

In the case of supplying the O-containing gas from the gas supply pipe 232b, an O-containing gas supply system is mainly configured by the gas supply pipe 232b, the MFC 241b, and the valve 243b. The O-containing gas supply system may also include the nozzle 249b. The O-containing gas supply system may be referred to as an oxidizing gas supply system or an oxidant supply system.

In the case of supplying the H-containing gas from the gas supply pipe 232b, an H-containing gas supply system is mainly configured by the gas supply pipe 232b, the MFC 241b, and the valve 243b. The H-containing gas supply system may also include the nozzle 249b. In the case of supplying an N- and H-containing gas from the gas supply pipe 232b, the H-containing gas supply system may be referred to as an N-containing gas supply system or an N- and H-containing gas supply system. Furthermore, in the case of supplying an N-, C- and H-containing gas from the gas supply pipe 232b, the H-containing gas supply system may be referred to as an N-containing gas supply system, a C-containing gas supply system, or an N- and C-containing gas supply system. The N-containing gas supply system may be referred to as a nitriding gas supply system or a nitriding agent supply system. In the case of supplying a hydrogen nitride-based gas, an amine-based gas or an organic hydrazine-based gas as the H-containing gas, the H-containing gas supply system may be referred to as a hydrogen nitride-based gas supply system, an amine-based gas supply system, or an organic hydrazine-based gas supply system.

One or all of the C-containing gas supply system, the O-containing gas supply system and the H-containing gas supply system may be referred to as a reaction gas supply system or a reactant supply system.

In the case of supplying an etching gas from the gas supply pipes 232a and 232b, an etching gas supply system is mainly configured by the gas supply pipes 232a and 232b, the MFCs 241a and 241b, and the valves 243a and 243b. The etching gas supply system may also include the nozzles 249a and 249b. In the case of supplying a fluorine-based gas from the gas supply pipes 232a and 232b, the etching gas supply system may be referred to as a fluorine-based gas supply system.

In addition, an inert gas supply system is mainly configured by the gas supply pipes 232c and 232d, the MFCs 241c and 241d, and the valves 243c and 243d. The inert gas supply system may be referred to as a purge gas supply system, a dilution gas supply system, or a carrier gas supply system.

An exhaust pipe 231 for exhausting an internal atmosphere of the process chamber 201 is installed in the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system is mainly configured by the exhaust pipe 231, the APC valve 244, and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. As such, the boat elevator 115 is configured as a transfer device (transfer mechanism) which transfers the boat 217, i.e., the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of a heat resistant material such as quartz or SiC may be installed below the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L-shape. The temperature sensor 263 is installed along the inner wall of the reaction tube 203.

Figure 3:
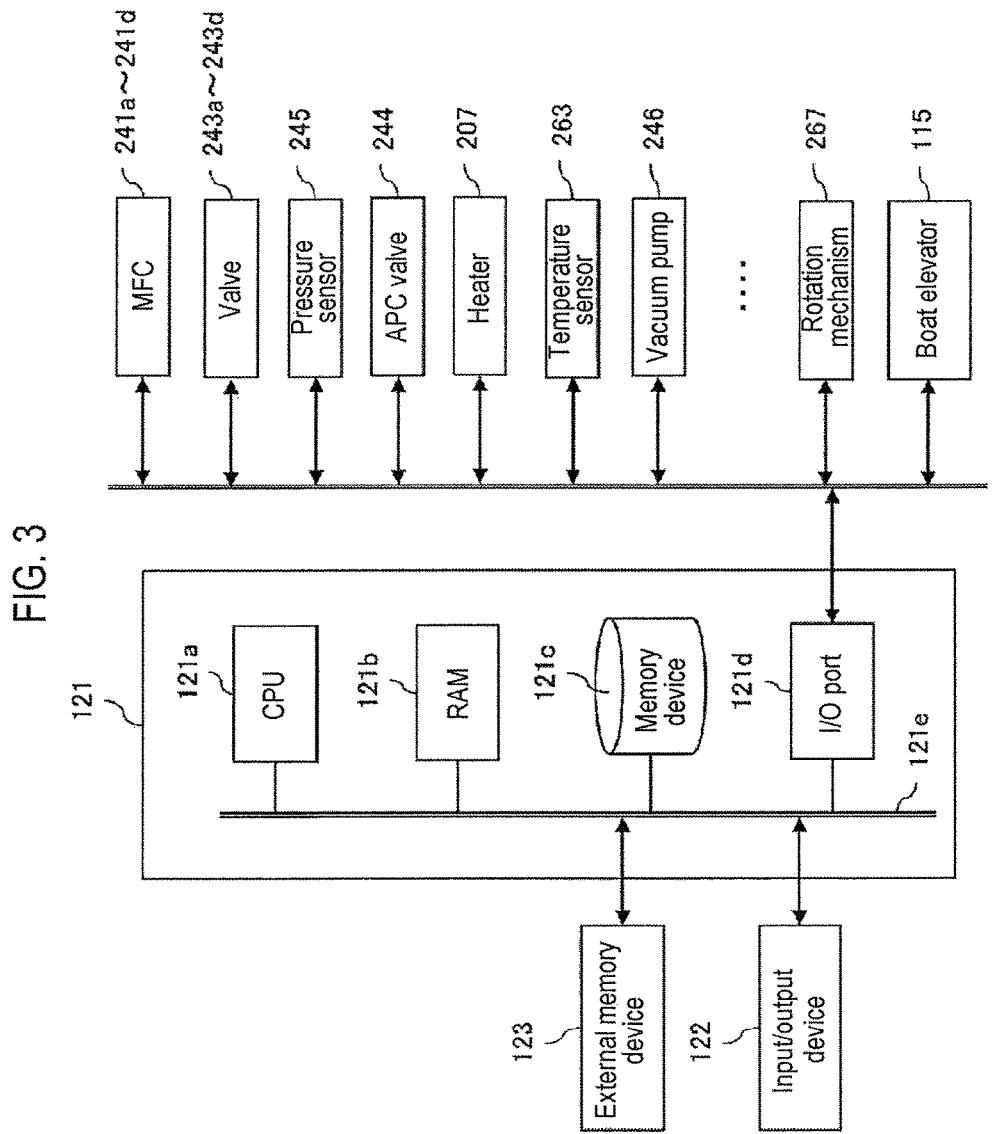
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e.

An input/output device 122 formed of, e.g., a touch panel or the like, is connected to the controller 121.

The memory device 121c is configured with, for example, a flash memory, a hard disc drive (HDD), or the like. A control program for controlling operations of a substrate processing apparatus, or an etching recipe and a process recipe, in which sequences and conditions of a nozzle etching process and a film forming process to be described later are written, are readably stored in the memory device 121c. The etching recipe and the process recipe function as a program for causing the controller 121 to execute each sequence in the substrate processing process, which will be described later, to obtain a predetermined result. Hereinafter, the etching recipe, the process recipe and the control program will be generally and simply referred to as a "program". Furthermore, the etching recipe and the process recipe will be simply referred to as a "recipe". When the term "program" is used herein, it may indicate a case of including only the recipe, a case of including only the control program, or a case of including both the recipe and the control program. In addition, the RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and the like.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like, according to contents of the read recipe.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Film Forming Process

A sequence example of a process for forming a thin film on a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121. Furthermore, in the present embodiment, a process of etching a surface of the nozzle 249b (hereinafter also referred to as a nozzle etching process or an etching process) is performed prior to performing the film forming process. Details of the etching process will be described later.

In the film forming process according to the present embodiment, a film is formed on the wafer 200 by performing, a predetermined number of times (once or more), a cycle that non-simultaneously performs: a step of supplying a precursor gas to the wafer 200 as a substrate in the process chamber 201, via the nozzle 249a as a first nozzle; a step of supplying an O-containing gas to the wafer 200 in the process chamber 201, via the nozzle 249b as a second nozzle made of quartz and differing from the nozzle 249a; and a step of supplying a H-containing gas to the wafer 200 in the process chamber 201, via the nozzle 249b.

Figure 4:
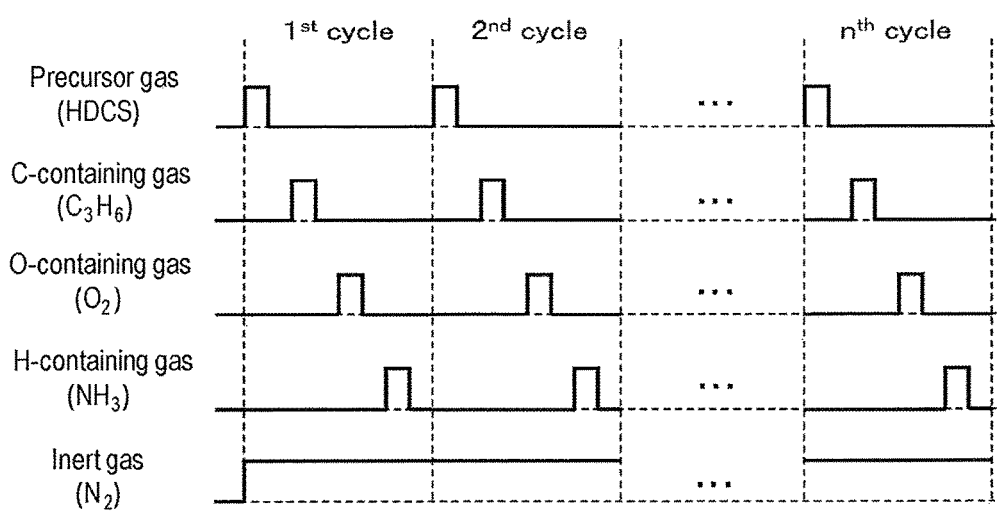
FIG. 4 is a diagram illustrating a film forming sequence according to one embodiment of the present disclosure.

In the film forming sequence illustrated in FIG. 4, for example, an Si-, O-, C- and N-containing film, namely a silicon oxycarbonitride film (SiOCN film), is formed on the wafer 200 by performing, a predetermined number of times (n times), a cycle that non-simultaneously, i.e., non-synchronously performs: step 1 of supplying an HCDS gas to the wafer 200 in the process chamber 201, via the nozzle 249a; step 2 of supplying a $C_3H_6$ gas to the wafer 200 in the process chamber 201, via the nozzle 249a; step 3 of supplying an $O_2$ gas to the wafer 200 in the process chamber 201, via the nozzle 249b; and step 4 of supplying an $NH_3$ gas to the wafer 200 in the process chamber 201, via the nozzle 249b. The SiOCN film may also be referred to as a C-containing silicon oxynitride film (SiON film), a C-added (doped) SiON film, or a C-containing SiON film.

In the present disclosure, for the sake of convenience, the film forming sequence illustrated in FIG. 4 may sometimes be denoted as follows. The same denotation will be used in the modifications and other embodiments to be described later.

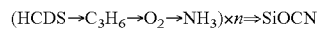

$(HCDS \to C_3H_6 \to O_2 \to NH_3) \times n \Rightarrow SiOCN$

When the term "wafer" is used in the present disclosure, the wafer may refer to "a wafer itself" or "a wafer and a laminated body (aggregate) of predetermined layers or films formed on a surface of the wafer". That is to say, a wafer including predetermined layers or films formed on its surface may be referred to as a wafer. In addition, when the phrase "a surface of a wafer" is used in the present disclosure, "a surface of a wafer" may refer to "a surface (exposed surface) of a wafer itself" or "a surface of a predetermined layer or film formed on a wafer, namely an uppermost surface of the wafer, which is a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used in the present disclosure, the "substrate" may be synonymous with the term "wafer." In this case, the term "wafer" and "substrate" may be used interchangeably in the foregoing descriptions.

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 through the O-ring 220.

(Pressure Regulation and Temperature Adjustment)

The interior of the process chamber 201, namely the space in which the wafers 200 exist, is vacuum-exhausted (de-pressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(SiOCN Film Forming Process)

Next, the following four steps, i.e., steps 1 to 4, are sequentially performed.

[Step 1]

At this step, a HCDS gas is supplied to the wafer 200 in the process chamber 201.

The valve 243a is opened to allow a HCDS gas to flow through the gas supply pipe 232a. A flow rate of the HCDS gas is adjusted by the MFC 241a, and then the HCDS gas is supplied into the process chamber 201 via the nozzle 249a and is exhausted through the exhaust pipe 231. At this time, the HCDS gas is supplied to the wafer 200. At the same time, the valve 243c is opened to allow a $N_2$ gas to flow through the gas supply pipe 232c. A flow rate of the $N_2$ gas is adjusted by the MFC 241c, and the $N_2$ gas is supplied into the process chamber 201 together with the HCDS gas and is exhausted through the exhaust pipe 231.

In order to prevent the HCDS gas from infiltrating into the nozzle 249b, the valves 243d is opened to allow the $N_2$ gas to flow through the gas supply pipe 232d. The $N_2$ gas is supplied into the process chamber 201 through the gas supply pipe 232b and the nozzle 249b and is exhausted through the exhaust pipe 231.

A supply flow rate of the HCDS gas, which is controlled by the MFC 241a, is set to fall within a range of, e.g., 1 to 2,000 sccm, specifically, 10 to 1,000 sccm. Supply flow rates of the $N_2$ gas, which are controlled by the MFCs 241c and 241d, are set to fall within a range of, e.g., 100 to 10,000 sccm. An internal pressure of the process chamber 201 is set to fall within a range of, e.g., 1 to 2,666 Pa, specifically 67 to 1,333 Pa. A time period for supplying the HCDS gas to the wafer 200, namely the gas supply time (irradiation time), is set to fall within a range of, e.g., 1 to 120 seconds, specifically, 1 to 60 seconds. The temperature of the heater 207 is set such that the temperature of the wafer 200 falls within a range of, e.g., 250 to 700 degrees C., specifically 300 to 650 degrees C., more specifically 350 to 600 degrees C.

If the temperature of the wafer 200 becomes lower than 250 degrees C., the HCDS gas is hardly chemisorbed onto the wafer 200. Thus, there may be a case where a practical deposition rate is not obtained. This problem may be solved by setting the temperature of the wafer 200 at 250 degrees C. or higher. By setting the temperature of the wafer 200 at 300 degrees C. or higher, ultimately at 350 degrees C. or higher, it is possible to allow the HCDS gas to be sufficiently adsorbed onto the wafer 200. Thus, a sufficient deposition rate is obtained.

If the temperature of the wafer 200 exceeds 700 degrees C., a CVD reaction becomes too strong (an excessive gas phase reaction is generated). Thus, the film thickness uniformity easily deteriorates and is hardly controlled. By setting the temperature of the wafer 200 at 700 degrees C. or lower, it is possible to generate a suitable gas phase reaction. This makes it possible to suppress deterioration of the film thickness uniformity and to control the film thickness uniformity. Particularly, if the temperature of the wafer 200 is set at 650 degrees C. or lower, ultimately at 600 degrees C. or lower, a surface reaction becomes more dominant than a gas phase reaction. This makes it easy to secure the film thickness uniformity and to control the film thickness uniformity.

Accordingly, the temperature of the wafer 200 may be set to fall within a range of 250 to 700 degrees C., specifically 300 to 650 degrees C., more specifically 350 to 600 degrees C.

By supplying the HCDS gas to the wafer 200 under the aforementioned conditions, a first layer, for example, a Cl- and Si-containing layer having a thickness of from less than one atomic layer to several atomic layers, is formed on the uppermost surface of the wafer 200. The Cl- and Si-containing layer may include a Cl-containing Si layer, an adsorption layer of HCDS, or both.

The Cl-containing Si layer is a generic name that encompasses a continuous or discontinuous layer containing Cl, which is composed of Si, and a Si thin film containing Cl, which is formed of the layers overlapping with one another. The continuous layer containing Cl, which is composed of Si, is sometimes referred to as a Si thin film containing Cl. The Si which constitutes the Si layer containing Cl includes not only Si whose bond to Cl is not completely broken, but also Si whose bond to Cl is completely broken.

The adsorption layer of HCDS includes not only a continuous adsorption layer composed of HCDS molecules but also a discontinuous adsorption layer. That is to say, the adsorption layer of HCDS includes an adsorption layer having a thickness of one molecular layer or less than one molecular layer, which is composed of HCDS molecules. The HCDS molecules that constitute the adsorption layer of HCDS include a molecule in which Si—Cl bonds are partially broken. That is to say, the adsorption layer of HCDS may include a physical adsorption layer of HCDS, a chemisorption layer of HCDS, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Si-containing layer containing Cl may include both a Si layer containing Cl and an adsorption layer of HCDS. As described above, expressions such as "one atomic layer", "several atomic layers" and the like will be used with respect to the Cl- and Si-containing layer.

Under a condition in which the HCDS gas is autolyzed (or pyrolyzed), i.e., a condition in which a pyrolysis reaction of the HCDS gas is generated, Si is deposited on the wafer 200 to form a Si layer containing Cl. Under a condition in which the HCDS gas is not autolyzed (or pyrolyzed), i.e., a condition in which a pyrolysis reaction of the HCDS gas is not generated, HCDS is adsorbed onto the wafer 200 to form an adsorption layer of HCDS. From the viewpoint of increasing the deposition rate, it may be more advantageous to form the Si layer containing Cl on the wafer 200 than to form the adsorption layer of HCDS on the wafer 200.

If the thickness of the first layer exceeds several atomic layers, a modifying reaction at steps 3 and 4, which will be described later, does not affect the entire first layer. In addition, a minimum value of the thickness of the first layer is less than one atomic layer. Accordingly, the thickness of the first layer may be set to fall within a range of less than one atomic layer to several atomic layers. By setting the thickness of the first layer to become one atomic layer or less, namely one atomic layer or less than one atomic layer, it is possible to relatively increase the action of a modifying reaction at steps 3 and 4 which will be described later and to shorten the time required in a modifying reaction at steps 3 and 4. It is also possible to shorten the time required in the formation of the first layer at step 1. Consequently, it is possible to shorten the processing time per one cycle. This makes it possible to shorten the total processing time. That is to say, it is possible to increase the deposition rate. Furthermore, by setting the thickness of the first layer to become one atomic layer or less, it is possible to enhance the controllability of the film thickness uniformity.

After the first layer is formed, the valve 243a is closed to stop the supply of the HCDS gas. At this time, the interior of the process chamber 201 is vacuum-exhausted by the vacuum pump 246 while opening the APC valve 244. Thus, the HCDS gas remaining in the process chamber 201, which has not reacted or which has contributed to the formation of the first layer, is discharged from the interior of the process chamber 201. At this time, the supply of the $N_2$ gas into the process chamber 201 is maintained while opening the valves 243c and 243d. The $N_2$ gas acts as a purge gas. This makes it possible to enhance the effect of discharging the gas remaining in the process chamber 201 from the interior of the process chamber 201.

In this case, the gas remaining in the process chamber 201 may not be completely discharged and the interior of the process chamber 201 may not be completely purged. If the amount of the gas remaining in the process chamber 201 is small, an adverse effect may not be generated at step 2 which will be subsequently performed. The flow rate of the $N_2$ gas supplied into the process chamber 201 need not be set at a high flow rate. For example, an amount of the $N_2$ gas to be supplied into the process chamber 201 may be set substantially equal to the volume of the reaction tube 203 (the process chamber 201) such that a purge operation is performed without causing an adverse effect at step 2. As such, by not completely purging the interior of the process chamber 201, it is possible to shorten the purge time and to improve the throughput. It is also possible to suppress the consumption of the $N_2$ gas at a necessary minimum level.

As the precursor gas, in addition to the HCDS gas, it may be possible to use, e.g., an inorganic halosilane precursor gas such as an OCTS gas, a dichlorosilane ($SiH_2Cl_2$, abbreviation: DCS) gas, a monochlorosilane ($SiH_3Cl$, abbreviation: MCS) gas, a tetrachlorosilane, i.e., silicon tetrachloride ($SiCl_4$, abbreviation: STC) gas, a trichlorosilane ($SiHCl_3$, abbreviation: TCS) gas, or the like.

Furthermore, as the precursor gas, it may be possible to use an organic halosilane precursor gas such as a BTCSE gas, a BTCSM gas, a TCDMDS gas, a DCTMDS gas, an MCPMDS gas, or the like.

Furthermore, as the precursor gas, it may be possible to use, e.g., a halogen-group-free inorganic silane precursor gas such as a monosilane ($SiH_4$, abbreviation: MS) gas, a disilane ($Si_2H_6$, abbreviation: DS) gas, a trisilane ($Si_3H_8$, abbreviation: TS) gas, or the like.

Furthermore, as the precursor gas, it may be possible to use, e.g., a halogen-group-free organic silane precursor gas such as a dimethyl silane ($SiC_2H_8$, abbreviation: DMS) gas, a trimethyl silane ($SiC_3H_{10}$, abbreviation; TMS) gas, a diethyl silane ($SiC_4H_{12}$, abbreviation: DES) gas, a 1,4-disilane butane ($Si_2C_2H_{10}$, abbreviation: DSB) gas, or the like.

Furthermore, as the precursor gas, it may be possible to use, e.g., a halogen-group-free amino-based (amine-based) silane precursor gas such as a trisdimethylaminosilane ($Si[N(CH_3)_2]_3H$, abbreviation: 3DMAS) gas, a tetrakisdimethylaminosilane ($Si[N(CH_3)_2]_4$, abbreviation: 4DMAS) gas, a bisdiethylaminosilane ($Si[N(C_2H_5)_2]_2H_2$, abbreviation: BDEAS) gas, a bis-tert-butylaminosilane ($SiH_2[NH(C_4H_9)]_2$, abbreviation: BTBAS) gas, or the like.

In the case where an organic halosilane precursor gas or an organic silane precursor gas acting as a C source is used as the precursor gas, it is possible to have C contained in the first layer. Consequently, the C concentration in the SiOCN film finally formed on the wafer 200 can be made higher than that of a case using an inorganic halosilane precursor gas or an inorganic silane precursor gas as the precursor gas. In the case where an aminosilane precursor gas acting as a C source and an N source is used as the precursor gas, it is possible to have C and N contained in the first layer. Consequently, the C concentration and the N concentration in the SiOCN film finally formed on the wafer 200 can be respectively made higher than those of a case using an inorganic silane precursor gas as the precursor gas.

As the inert gas, in addition to the $N_2$ gas, it may be possible to use, e.g., a rare gas such as an Ar gas, a He gas, a Ne gas, a Xe gas or the like.

[Step 2]

After step 1 is completed, a thermally-activated $C_3H_6$ gas is supplied to the wafer 200 in the process chamber 201, namely the first layer formed on the wafer 200.

At this step, the opening/closing control of the valves 243a, 243c and 243d is performed in the same procedure as the opening/closing control of the valves 243a, 243c and 243d performed at step 1. The flow rate of the $C_3H_6$ gas is adjusted by the MFC 241a and then the $C_3H_6$ gas is supplied into the process chamber 201 via the nozzle 249a and is exhausted through the exhaust pipe 231. At this time, the $C_3H_6$ gas is supplied to the wafer 200.

The supply flow rate of the $C_3H_6$ gas controlled by the MFC 241a is set to fall within a range of, e.g., 100 to 10,000 sccm. The internal pressure of the process chamber 201 is set to fall within a range of, e.g., 1 to 5,000 Pa, specifically 1 to 4,000 Pa. The partial pressure of the $C_3H_6$ gas in the process chamber 201 is set to fall within a range of, e.g., 0.01 to 4,950 Pa. By setting the internal pressure of the process chamber 201 to fall within such a relatively high pressure zone, it is possible to thermally activate the $C_3H_6$ gas in a non-plasma manner. If the $C_3H_6$ gas is supplied by thermally activating the same, it is possible to generate a relatively soft reaction. This makes it easy to form a C-containing layer which will be described later. A time period for supplying the $C_3H_6$ gas to the wafer 200, namely the gas supply time (irradiation time), is set to fall within a range of, e.g., 1 to 200 seconds, specifically, 1 to 120 seconds, more specifically 1 to 60 seconds. Other processing conditions may be similar to, e.g., the processing conditions of step 1.

At this time, the gas flowing into the process chamber 201 is a thermally-activated $C_3H_6$ gas. The HCDS gas does not flow into the process chamber 201. Accordingly, the $C_3H_6$ gas does not make a gas phase reaction and is supplied to the wafer 200 in an activated state. As a result, a carbon-containing layer (C-containing layer) is formed on the surface of the first layer, namely the Cl- and Si-containing layer, which is formed on the wafer 200 at Step 1. The C-containing layer may include a C layer, an adsorption layer of $C_3H_6$, or both. The C-containing layer becomes a layer having a thickness of less than one molecular layer or less than one atomic layer, namely a discontinuous layer. For example, in the case where an adsorption layer of $C_3H_6$ is formed as the C-containing layer, a chemisorption layer of molecules that constitute $C_3H_6$ is formed in an unsaturated state. Thus, a second layer containing Si, Cl and C is formed on the uppermost surface of the wafer 200. The second layer becomes a layer which includes the Cl- and Si-containing layer and the C-containing layer. Depending on the conditions, there may be a case where the first layer is modified (carbonized) by the reaction of a portion of the first layer and the $C_3H_6$ gas so that a SiC layer is included in the second layer.

The C-containing layer needs to be a discontinuous layer. If the C-containing layer is a continuous layer, the surface of the Cl- and Si-containing layer is totally covered with the C-containing layer. In this case, Si does not exist on the surface of the second layer. As a result, there may be a case where the occurrence of the oxidizing reaction of a second layer at step 3 to be described later and the nitriding reaction of a third layer at step 4 to be described later may be difficult. This is because, under the above-described processing conditions, O or N is bonded to Si and is hardly bonded to C. In order to generate a desired or specified reaction at step 3 or 4 which will be described later, the adsorption state of the C-containing layer, for example, the chemisorption layer of $C_3H_6$, onto the Cl- and Si-containing layer needs to be an unsaturated state, and Si needs to be exposed on the surface of the second layer. In addition, by setting the processing conditions at step 2 to fall within the range of the aforementioned processing conditions, it is possible to make the C-containing layer become a discontinuous layer.

After the second layer is formed, the valve 243a is closed to stop the supply of the $C_3H_6$ gas. By the processing procedures and the processing conditions similar to those of step 1, the $C_3H_6$ gas remaining in the process chamber 201, which has not reacted or which has contributed to the formation of the C-containing layer, and the reaction byproducts remaining in the process chamber 201 are discharged from the interior of the process chamber 201. At this time, similar to step 1, the gas and the like remaining in the process chamber 201 may not be completely discharged.

As the C-containing gas, in addition to the $C_3H_6$ gas, it may be possible to use a hydrocarbon-based gas such as an acetylene ($C_2H_2$) gas, an ethylene ($C_2H_4$) gas or the like.

As the inert gas, in addition to the $N_2$ gas, it may be possible to use, e.g., various kinds of rare gases illustrated at step 1.

[Step 3]

After step 2 is completed, a thermally-activated $O_2$ gas is supplied to the wafer 200 in the process chamber 201, namely the second layer formed on the wafer 200.

At this step, the opening/closing control of the valves 243b to 243d is performed in the same procedure as the opening/closing control of the valves 243a, 243c and 243d performed at step 1. The flow rate of the $O_2$ gas is adjusted by the MFC 241b and then the $O_2$ gas is supplied into the process chamber 201 via the nozzle 249b and is exhausted through the exhaust pipe 231. At this time, the $O_2$ gas is supplied to the wafer 200.

The supply flow rate of the $O_2$ gas controlled by the MFC 241b is set to fall within a range of, e.g., 100 to 10,000 sccm. The internal pressure of the process chamber 201 is set to fall within a range of, e.g., 1 to 4,000 Pa, specifically 1 to 3,000 Pa. The partial pressure of the $O_2$ gas in the process chamber 201 is set to fall within a range of, e.g., 0.01 to 3,960 Pa. By setting the internal pressure of the process chamber 201 to fall within such a relatively high pressure zone, it is possible to thermally activate the $O_2$ gas in a non-plasma manner. If the $O_2$ gas is supplied by thermally activating the same, it is possible to generate a relatively soft reaction. This makes it possible to softly perform the oxidation which will be described later. A time period for supplying the $O_2$ gas to the wafer 200, namely the gas supply time (irradiation time), is set to fall within a range of e.g., 1 to 120 seconds, specifically 1 to 60 seconds. Other processing conditions may be similar to, e.g., the processing conditions of step 1.

At this time, the gas flowing into the process chamber 201 is a thermally-activated $O_2$ gas. The HCDS gas and the $C_3H_6$ gas do not flow into the process chamber 201. Accordingly, the $O_2$ gas does not make a gas phase reaction and is supplied to the wafer 200 in an activated state. The $O_2$ gas supplied to the wafer 200 reacts with at least a portion of the Si-, Cl- and C-containing second layer (the layer including the Cl- and Si-containing layer and the C-containing layer) formed on the wafer 200 at step 2. Thus, the second layer is thermally oxidized in a non-plasma manner and is changed (modified) into a Si-, O- and C-containing third layer, namely a silicon oxycarbide layer (SiOC layer). When forming the third layer, the impurities such as Cl and the like contained in the second layer make up a gaseous material containing at least Cl in the course of the modifying reaction generated by the $O_2$ gas. The gaseous material is discharged from the interior of the process chamber 201. That is to say, the impurities such as Cl and the like contained in the second layer are extracted or desorbed from the second layer and are separated from the second layer. Thus, the third layer becomes a layer containing fewer impurities such as Cl and the like than the second layer.

At this time, the oxidizing reaction of the second layer is kept unsaturated. For example, if the Cl- and Si-containing layer having a thickness of several atomic layers is formed at step 1 and if the C-containing layer having a thickness of less than one atomic layer is formed at step 2, at least a portion of the surface layer (the one atomic layer of the surface) is oxidized. In this case, in order not to oxidize the entire second layer, oxidation is performed under a condition in which the oxidizing reaction of the second layer is unsaturated. Depending on the conditions, some layers existing below the surface layer of the second layer may be oxidized. However, from the viewpoint of enhancing the controllability of a composition ratio of a SiOCN film finally formed on the wafer 200, it is advisable to oxidize only the surface layer. Furthermore, for example, even if the Cl- and Si-containing layer having a thickness of one atomic layer or less than one atomic layer is formed at step 1 and even if the C-containing layer having a thickness of less than one atomic layer is formed at step 2, a portion of the surface layer is similarly oxidized. Even in this case, in order not to oxidize the entire second layer, oxidation is performed under a condition in which the oxidizing reaction of the second layer is unsaturated. In addition, by setting the processing conditions at step 3 to fall within the range of the aforementioned processing conditions, it is possible to make the oxidizing reaction of the second layer unsaturated.

At this time, in particular, the aforementioned processing conditions may be adjusted so as to increase a dilution ratio of the $O_2$ gas (to reduce the concentration of the $O_2$ gas), or to shorten the supply time of the $O_2$ gas, or to reduce the partial pressure of the $O_2$ gas. For example, as compared with steps 2 and 4, the dilution ratio of the reaction gas may be increased, the supply time of the reaction gas may be shortened, or the partial pressure of the reaction gas may be reduced. This makes it possible to moderately lower the oxidizing power at step 3. It also becomes easier to make the oxidizing reaction unsaturated.

By lowering the oxidizing power at step 3, it becomes possible to suppress desorption of C from the second layer in the oxidizing process. Since a Si—O bond is higher in bonding energy than a Si—C bond, there is a tendency that, if the Si—O bond is formed, the Si—C bond is broken. In contrast, by moderately lowering the oxidizing power at step 3, it is possible to restrain the Si—C bond from being broken when forming the Si—O bond within the second layer. This makes it possible to restrain C whose bond to Si is broken, from being desorbed from the second layer.

Furthermore, by lowering the oxidizing power at step 3, it is possible to keep Si exposed on the uppermost surface of the oxidized second layer, i.e., the third layer. By keeping Si exposed on the uppermost surface of the third layer, it becomes easy to nitride the uppermost surface of the third layer at step 4 which will be described later. In a state in which the Si—O bond or the Si—C bond is formed over the entire uppermost surface of the third layer and in which Si is not exposed on the uppermost surface, there is a tendency that a Si—N bond is hardly formed under the conditions of step 4. However, by keeping Si exposed on the uppermost surface of the third layer, namely by allowing Si, which is capable of making a bond with N under the conditions of step 4 to be described later, to exist on the uppermost surface of the third layer, it becomes easy to form a Si—N bond.

After the third layer is formed, the valve 243b is closed to stop the supply of the $O_2$ gas. By the processing procedures and the processing conditions similar to those of step 1, the $O_2$ gas remaining in the process chamber 201, which has not reacted or which has contributed to the formation of the third layer, and the reaction byproducts remaining in the process chamber 201 are discharged from the interior of the process chamber 201. At this time, similar to step 1, the gas and the like remaining in the process chamber 201 may not be completely discharged.

As the oxidizing gas, in addition to the $O_2$ gas, it may be possible to use an O-containing gas such as water vapor ($H_2O$ gas), nitric monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas or the like.

As the inert gas, in addition to the $N_2$ gas, it may be possible to use, e.g., various kinds of rare gases illustrated at step 1.

[Step 4]

After step 3 is completed, a thermally-activated $NH_3$ gas is supplied to the wafer 200 in the process chamber 201, namely the third layer formed on the wafer 200.

At this step, the opening/closing control of the valves 243b to 243d is performed in the same procedure as the opening/closing control of the valves 243a, 243c and 243d performed at step 1. The flow rate of the $NH_3$ gas is adjusted by the MFC 241b and then the $NH_3$ gas is supplied into the process chamber 201 via the nozzle 249b and is exhausted through the exhaust pipe 231. At this time, the $NH_3$ gas is supplied to the wafer 200.

The supply flow rate of the $NH_3$ gas controlled by the MFC 241b is set to fall within a range of, e.g., 100 to 10,000 sccm. The internal pressure of the process chamber 201 is set to fall within a range of, e.g., 1 to 4,000 Pa, specifically 1 to 3,000 Pa. The partial pressure of the $NH_3$ gas in the process chamber 201 is set to fall within a range of, e.g., 0.01 to 3,960 Pa. By setting the internal pressure of the process chamber 201 to fall within such a relatively high pressure zone, it is possible to thermally activate the $NH_3$ gas in a non-plasma manner. If the $NH_3$ gas is supplied by thermally activating the same, it is possible to generate a relatively soft reaction. This makes it possible to relatively softly perform the nitriding which will be described later. The time period for supplying the thermally-activated $NH_3$ gas to the wafer 200, namely the gas supply time (irradiation time), is set to fall within a range of, e.g., 1 to 120 seconds, specifically 1 to 60 seconds. Other processing conditions may be similar to, e.g., the processing conditions of step 1.

At this time, the gas flowing into the process chamber 201 is a thermally-activated $NH_3$ gas. The HCDS gas, the $C_3H_6$ gas and the $O_2$ gas do not flow into the process chamber 201. Accordingly, the $NH_3$ gas does not make a gas phase reaction and is supplied to the wafer 200 in an activated state. The $NH_3$ gas supplied to the wafer 200 reacts with at least a portion of the third layer (SiOC layer) formed on the wafer 200 at step 3. Thus, the third layer is thermally nitrided in a non-plasma manner and is changed (modified) into a Si-, O-, C- and N-containing fourth layer, namely a silicon oxycarbonitride layer (SiOCN layer). When forming the fourth layer, the impurities such as Cl and the like contained in the third layer make up a gaseous material containing at least Cl in the course of the modifying reaction caused by the $NH_3$ gas. The gaseous material is discharged from the interior of the process chamber 201. That is to say, the impurities such as Cl and the like contained in the third layer are extracted or desorbed from the third layer and are separated from the third layer. Thus, the fourth layer becomes a layer containing fewer impurities such as Cl and the like than the third layer.

Furthermore, by supplying the activated $NH_3$ gas to the wafer 200, the uppermost surface of the third layer is modified in the course of nitriding of the third layer. The uppermost surface of the third layer subjected to the surface modifying process in the course of nitriding, namely the uppermost surface of the fourth layer, becomes a surface on which HCDS is easily adsorbed and Si is easily deposited at step 1, which will be performed in the next cycle. That is to say, the $NH_3$ gas used at step 4 acts as an adsorption/deposition promoting gas which promotes adsorption and deposition of HCDS or Si on the upper surface of the fourth layer (the uppermost surface of the wafer 200).

At this time, the nitriding reaction of the third layer is kept unsaturated. For example, if the third layer having a thickness of several atomic layers is formed at steps 1 to 3, at least a portion of the surface layer (the one atomic layer of the surface) is nitrided. In this case, in order not to nitride the entire third layer, nitriding is performed under a condition in which the nitriding reaction of the third layer remains unsaturated. Depending on the conditions, some layers existing below the surface layer of the third layer may be nitrided. However, from the viewpoint of enhancing the controllability of a composition ratio of a SiOCN film finally formed on the wafer 200, it is advisable to nitride only the surface layer. Furthermore, for example, even if the third layer having a thickness of one atomic layer or less than one atomic layer is formed at steps 1 to 3, a portion of the surface layer is similarly nitrided. Even in this case, in order not to nitride the entire third layer, nitriding is performed under a condition in which the nitriding reaction of the third layer remains unsaturated. In addition, by setting the processing conditions at step 4 to fall within the range of the aforementioned processing conditions, it is possible to make the nitriding reaction of the third layer unsaturated.

After the fourth layer is formed, the valve 243b is closed to stop the supply of the NH$_3$ gas. By the processing procedures and the processing conditions similar to those of step 1, the NH$_3$ gas remaining in the process chamber 201, which has not reacted or which has contributed to the formation of the fourth layer, and the reaction byproducts remaining in the process chamber 201 are discharged from the interior of the process chamber 201. At this time, similar to step 1, the gas and the like remaining in the process chamber 201 may not be completely discharged.

As the nitriding gas, in addition to the NH$_3$ gas, it may be possible to use a hydrogen nitride-based gas such as a diazene (N$_2$H$_2$) gas, a hydrazine (N$_2$H$_4$) gas, an N$_3$H$_8$ gas or the like, or a gas containing these compounds.

As the inert gas, in addition to the N$_2$ gas, it may be possible to use, e.g., various kinds of rare gases illustrated at step 1.

(Performing a Predetermined Number of Times)

The cycle which non-simultaneously, i.e., non-synchronously, performs the above-described four steps is performed a predetermined number of times (n times) to thereby form a SiOCN film having a predetermined composition and a predetermined thickness on the wafer 200. The above cycle may be repeated multiple times. That is to say, the thickness of the fourth layer (SiOCN layer) formed when performing the aforementioned cycle once may be set to become smaller than a desired film thickness. Thus, the above cycle may be repeated multiple times until the film thickness of the SiOCN film formed by laminating the fourth layers (SiOCN layers) becomes equal to the desired film thickness.

(Purge and Return to Atmospheric Pressure)

After the formation of the SiOCN film is completed, the valves 243c and 243d are opened. The N$_2$ gas is supplied into the process chamber 201 from each of the gas supply pipes 232c and 232d, and is exhausted through the exhaust pipe 231. The N$_2$ gas serves as a purge gas. Thus, the interior of the process chamber 201 is purged, and the residual gas and the reaction byproducts remaining in the process chamber 201 are removed from the interior of the process chamber 201 (purge). Thereafter, the internal atmosphere of the process chamber 201 is substituted with an inert gas (inert gas substitution), and the internal pressure of the process chamber 201 is returned to an atmospheric pressure (return to atmospheric pressure).

(Boat Unloading and Wafer Discharge)

The seal cap 219 is moved down by the boat elevator 115 to open the lower end of the reaction tube 203. The processed wafers 200 supported by the boat 217 are unloaded from the lower end of the reaction tube 203 outside of the reaction tube 203 (boat unloading). Thereafter, the processed wafers 200 are discharged from the boat 217 (wafer discharge).

(3) Nozzle Etching Process

In the film forming process described above, steps 1 to 4 are performed non-simultaneously. That is to say, after the residual gas and the like existing in the process chamber 201 are removed, the precursor gas (the HCDS gas) or the reaction gas (the O$_2$ gas, the NH$_3$ gas, etc.) is supplied into the process chamber 201. By doing so, it is possible to avoid a gas phase reaction of the precursor gas and the reaction gas, for example, a gas phase reaction of the HCDS gas and the O$_2$ gas or a gas phase reaction of the HCDS gas and the NH$_3$ gas, which may otherwise be generated in the process chamber 201. Consequently, it is possible to suppress generation of particles in the process chamber 201.

Furthermore, in the film forming process described above, the O$_2$ gas or the NH$_3$ gas is supplied through the nozzle 249b differing from the nozzle 249a through which the HCDS gas is supplied. Furthermore, at step 1, the infiltration of the HCDS gas into the nozzle 249b is prevented by supplying the N$_2$ gas into the nozzle 249b. Moreover, at steps 3 and 4, the infiltration of the O$_2$ gas and the NH$_3$ gas into the nozzle 249a is prevented by supplying the N$_2$ gas into the nozzle 249a. By doing so, it is possible to avoid a gas phase reaction of the HCDS gas and the O$_2$ gas or a gas phase reaction of the HCDS gas and the NH$_3$ gas, which may otherwise be generated in the nozzles 249a and 249b. Consequently, it is possible to suppress generation of particles in the nozzles 249a and 249b.

However, according to the extensive studies conducted by the present inventors, it was found that, even when the film forming process is performed in the aforementioned manner, a large amount of particles are generated near the nozzle 249b and may sometimes adhere to the wafer 200.

According to the extensive studies conducted by the present inventors, it was revealed that in the manufacturing process of the nozzle 249b, a small amount of impurities including a metallic element such as, for example, iron (Fe), titanium (Ti), aluminum (Al) or the like (hereinafter simply referred to as impurities) may sometimes be included in the inner surface (the inner circumferential surface or the inner wall surface) or the outer surface (the outer circumferential surface or the outer wall surface) of the nozzle 249b. It was also discovered that if an O$_2$ gas and NH$_3$ gas are supplied in a mixed state to the surface (the inner surface or the outer surface) of the nozzle 249b including the impurities, a large amount of particles may sometimes be generated. Hereinafter, a mechanism of generation of particles will be described in detail.

If a process of exhausting the O$_2$ gas from the interior of the process chamber 201 is performed at step 3, the O$_2$ gas is exhausted not only from the interior of the process chamber 201 but also from the interior of the nozzle 249b. However, even in this case, there may be a case where a small amount of the O$_2$ gas adheres to and remains on the inner surface or the outer surface of the nozzle 249b. At step 4 performed immediately after step 3, the O$_2$ gas adhering to the inner surface of the nozzle 249b is mixed with (meets with) the NH$_3$ gas supplied into the nozzle 249b. Furthermore, at step 4, the $O_2$ gas adhering to the outer surface of the nozzle 249b is mixed with (meets with) the $NH_3$ gas supplied into the nozzle 249b.

Furthermore, if a process of exhausting the $NH_3$ gas from the interior of the process chamber 201 is performed at step 4, the $NH_3$ gas is exhausted not only from the interior of the process chamber 201 but also from the interior of the nozzle 249b. However, even in this case, there may be a case where a small amount of the $NH_3$ gas adheres to and remains on the inner surface or the outer surface of the nozzle 249b. At step 3 of the next cycle, the $NH_3$ gas adhering to the inner surface of the nozzle 249b is mixed with (meets with) the $O_2$ gas supplied into the nozzle 249b. Furthermore, at step 4 of the next cycle, the $NH_3$ gas adhering to the outer surface of the nozzle 249b is mixed with (meets with) the $O_2$ gas supplied into the nozzle 249b.

If the $O_2$ gas and the $NH_3$ gas are mixed with each other, there may be a case where the $O_2$ gas and the $NH_3$ gas react with each other to generate active radicals including an OH group or the like. It is presumed that the radicals react with the impurities which include a metallic element and which exist on the inner surface or the outer surface of the nozzle 249b, thereby generating a large amount of fine particles.

The present inventors have confirmed that if a film forming process is performed under a situation where the $O_2$ gas and the $NH_3$ gas cannot be mixed with each other, for example, if one of step 3 of supplying the $O_2$ gas and step 4 of supplying the $NH_3$ gas is not implemented, it is possible to avoid generation of fine particles near the nozzle 249b. Furthermore, the present inventors have confirmed that if a film forming process is performed under a situation where the $O_2$ gas and the $NH_3$ gas can be mixed with each other, namely if steps 3 and 4 are implemented, there may be a case where a large amount of fine particles are generated near the nozzle 249b even when step 1 of supplying the HCDS gas is not implemented.

Figure 6A:
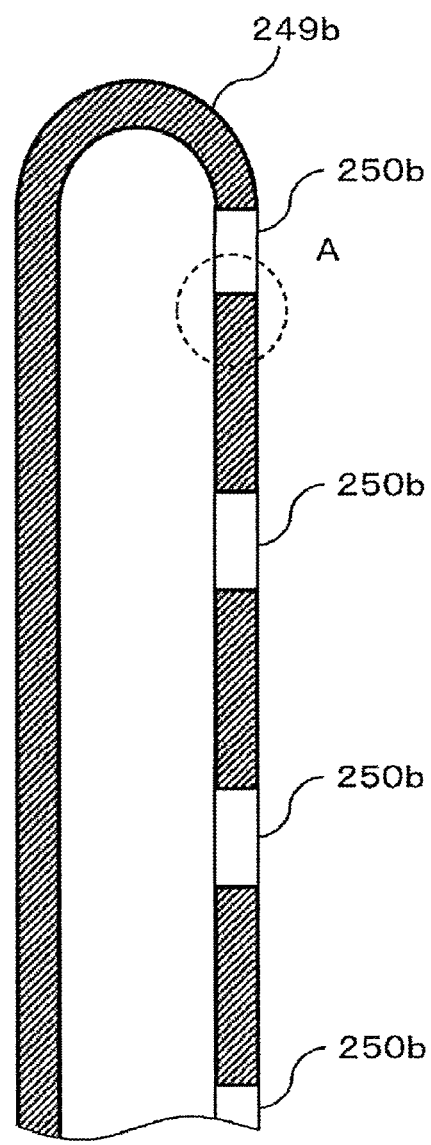
FIG. 6A is a vertical sectional view of a second nozzle which is not yet subjected to an etching process.
Figure 6B:
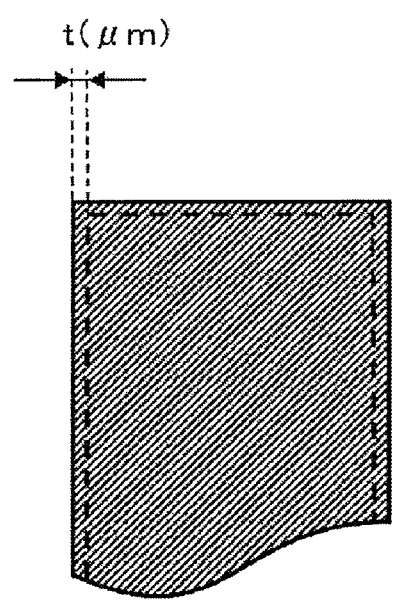
FIG. 6B is a partially-enlarged sectional view of the second nozzle illustrated in FIG. 6A.

According to the extensive studies conducted by the present inventors, it was found that when the manufacture of the nozzle 249b is completed, the impurities including a metallic element such as Fe, Ti, Al or the like is distributed over a depth which falls within a range of 10 μm from the surface of the nozzle 249b. Thus, in the present embodiment, the aforementioned problem is solved by etching each of the inner surface and the outer surface of the nozzle 249b at a predetermined depth prior to performing the film forming process. FIG. 6A is a vertical sectional view of the nozzle 249b, and FIG. 6B is a partially-enlarged sectional view of region A of the nozzle 249b illustrated in FIG. 6A. In FIG. 6B, a solid line indicates the surface of the nozzle 249b available before etching and a dotted line indicates the surface of the nozzle 249b available after etching.

Figure 5A:
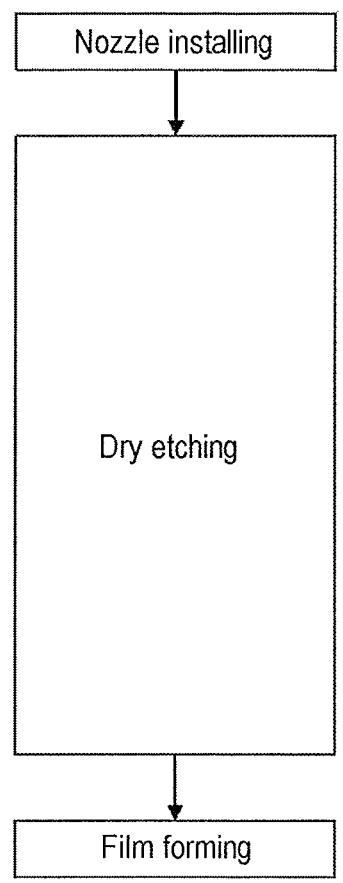
FIG. 5A is a diagram illustrating sequence example 1 of a nozzle etching process according to one embodiment of the present disclosure.
Figure 5B:
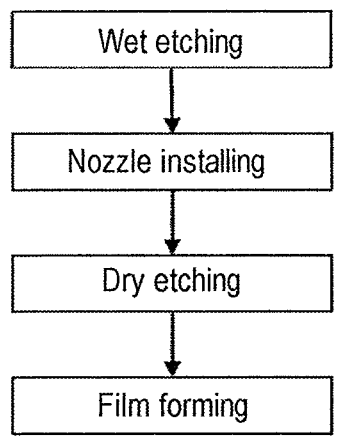
FIG. 5B is a diagram illustrating sequence example 2 of a nozzle etching process according to one embodiment of the present disclosure.
Figure 5C:
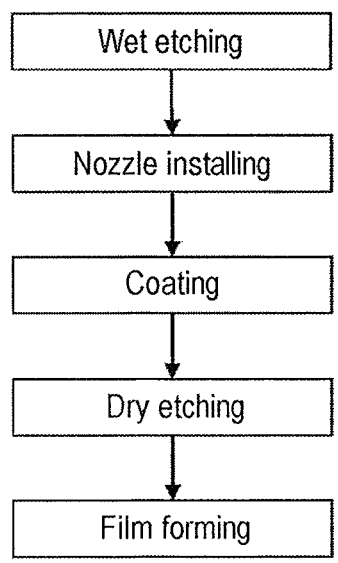
FIG. 5C is a diagram illustrating sequence example 3 of a nozzle etching process according to one embodiment of the present disclosure.

An etching process can be performed by one of the sequences illustrated in FIGS. 5A to 5C. Hereinafter, various kinds of sequences of the etching process will be described.

In the following descriptions, one or both of the inner surface and the outer surface of the nozzle will be simply referred to as a "nozzle surface". Furthermore, the impurity-containing layer formed on the nozzle surface will be referred to as an "impurity-containing layer".

Furthermore, in the following descriptions, there is illustrated an example in which both the inner surface and the outer surface of the nozzle 249b are etched. However, the present embodiment is not limited to this example. For example, it may be possible to etch only the inner surface of the nozzle 249b or only the outer surface of the nozzle 249b. It is easier for the $O_2$ gas or the $NH_3$ gas to remain on the inner surface of the nozzle 249b than on the outer surface of the nozzle 249b. There is a tendency that particles are more easily generated on the inner surface of the nozzle 249b than on the outer surface of the nozzle 249b. Thus, it is advisable to etch at least the inner surface of the nozzle 249b.

Moreover, in the following descriptions, there is illustrated an example in which the surfaces of the nozzles 249b and 249a are etched. However, the present embodiment is not limited to this example. For example, it may be possible to etch only the surface of the nozzle 249b without etching the surface of the nozzle 249a.

Sequence Example 1

As illustrated in FIG. 5A, in this sequence example, the nozzles 249a and 249b are installed in the process chamber 201 and then the surfaces of the nozzles 249a and 249b are dry-etched at a predetermined depth. Hereinafter, the detailed procedures of this sequence example will be described.

The finally-manufactured nozzles 249a and 249b, namely the nozzles 249a and 249b each having an impurity-containing layer formed on the surface thereof, are installed in the process chamber 201. Thereafter, an empty boat 217, namely a boat 217 not charged with the wafers 200, is lifted up by the boat elevator 115 and is loaded into the process chamber 201. Then, the interior of the process chamber 201 is vacuum-exhausted by the vacuum pump 246 so that the internal pressure of the process chamber 201 becomes a predetermined etching pressure. Furthermore, the interior of the process chamber 201, namely the surfaces of the nozzles 249a and 249b, is heated by the heater 207 to a predetermined etching temperature. If the internal pressure and temperature of the process chamber 201 reach the predetermined etching pressure and the predetermined etching temperature, respectively, a control is executed so that the predetermined etching pressure and the predetermined etching temperature are maintained until the etching process of the nozzles 249a and 249b is completed. Subsequently, the rotation of the boat 217 is started by the rotation mechanism 267. The rotation of the boat 217 is continuously performed until the etching process of the nozzles 249a and 249b is completed. However, the boat 217 may not be rotated.

While maintaining the internal pressure and temperature of the process chamber 201 at the predetermined etching pressure and the predetermined etching temperature, the valves 243a and 243b are opened and an $F_2$ gas is supplied into the process chamber 201 via the heated nozzles 249a and 249b. At this time, the valves 243c and 243d may be opened to supply a $N_2$ gas from the gas supply pipes 232c and 232d, thereby diluting the $F_2$ gas in the gas supply pipes 232c and 232d. By controlling the supply flow rate of the $N_2$ gas, it is possible to control the concentrations of the $F_2$ gas supplied into the nozzles 249a and 249b and the process chamber 201.

The $F_2$ gas supplied into the nozzles 249a and 249b is supplied to the inner surfaces of the heated nozzles 249a and 249b, thereby etching the inner surfaces of the nozzles 249a and 249b. Furthermore, the $F_2$ gas supplied into the process chamber 201 via the nozzles 249a and 249b is also supplied to the outer surfaces of the heated nozzles 249a and 249b, thereby etching the outer surfaces of the nozzles 249a and 249b.

If the surfaces of the nozzles 249a and 249b are etched at a desired depth, the valves 243a and 243b are closed to stop the supply of the $F_2$ gas into the process chamber 201. Then, the valves 243c and 243d are opened to allow the $N_2$ gas to flow from the gas supply pipes 232c and 232d into the process chamber 201. The N₂ gas is exhausted through the exhaust pipe 231. The N₂ gas acts as a purge gas. Thus, the interior of the process chamber 201 is purged. Thereafter, the internal atmosphere of the process chamber 201 is substituted with the N₂ gas (inert gas substitution) and the internal pressure of the process chamber 201 is returned to an atmospheric pressure (return to atmospheric pressure).

Thereafter, the seal cap 219 is moved down by the boat elevator 115. The empty boat 217 is unloaded to the outside of the reaction tube 203 (boat unloading). After the series of processes are completed, the aforementioned film forming process is performed.

The processing conditions of the dry etching process are illustrates as follows.

Etching pressure: 1,333 Pa to 26,600 Pa
Etching temperature: 400 degrees C. or more, specifically 400 to 600 degrees C., more specifically 400 to 500 degrees C.
F₂ gas supply flow rate: 0.5 to 5 slm
N₂ gas supply flow rate: 1 to 20 slm By setting the respective processing conditions at the values which fall within the aforementioned ranges, it becomes possible to appropriately perform the etching process of the nozzles 249a and 249b.

Furthermore, the thickness of the layers removed from the surfaces of the nozzles 249a and 249b, namely the etching depth t (see FIG. 6B), is set to fall within a range of, e.g., 15 µm or more and 30 µm or less (specifically, 20 µm or more and 25 µm or less).

If the etching depth t is less than 15 µm, the removal of impurities from the surfaces of the nozzles 249a and 249b, namely the removal of the impurity-containing layer, may become insufficient and fine particles may be easily generated near the nozzle 249b. This problem can be solved by setting the etching depth t to become 15 µm or more. By setting the etching depth t to become 20 µm or more, it is possible to reliably perform the removal of the impurity-containing layers from the surfaces of the nozzles 249a and 249b and to reliably avoid the generation of particles.

If the etching depth t exceeds 30 µm, the time required in etching, namely the down-time of the substrate processing apparatus, may become longer and the productivity of the substrate processing apparatus may become lower. Furthermore, a layer not containing impurities may be removed. Moreover, the diameter of the gas supply holes 250a and 250b formed in the nozzles 249a and 249b may be enlarged and the gas supply conditions when performing the film forming process may be changed. In addition, the surfaces of the nozzles 249a and 249b may become whitened so that the outward appearance of the nozzles 249a and 249b is damaged. These problems can be solved by setting the etching depth t to become 30 µm or less. By setting the etching depth t to become 25 µm or less, it is possible to shorten the time required in etching, namely the down-time of the substrate processing apparatus, and to further enhance the productivity of the substrate processing apparatus. In addition, it is possible to reliably suppress the enlargement of the diameter of the gas supply holes 250a and 250b and the generation of a poor outward appearance of the nozzles 249a and 249b.

Consequently, it is advisable that by performing the dry etching, the surfaces of the nozzles 249a and 249b are etched at the depth which falls within a range of 15 µm or more and 30 µm or less (specifically, 20 µm or more and 30 µm or less).

Sequence Example 2

As illustrated in FIG. 5B, in this sequence example, the surfaces of the nozzles 249a and 249b are wet-etched at a predetermined depth prior to installing the nozzles 249a and 249b in the process chamber 201. After the wet-etched nozzles 249a and 249b are installed in the process chamber 201, the surfaces of the nozzles 249a and 249b are dry-etched at a predetermined depth.

The wet-etching of the surfaces of the nozzles 249a and 249b can be performed by, for example, immersing the nozzles 249a and 249b in an etching solution. As the etching solution, it may be possible to use, for example, a hydrogen fluoride (HF) solution diluted at a concentration which falls within a range of 1% or more and 10% or less. Thus, it is possible to uniformly etch the inner surfaces and the outer surfaces of the nozzles 249a and 249b at an etching rate higher than the etching rate of the dry etching.

The dry etching of the surfaces of the nozzles 249a and 249b can be performed by, for example, the processing procedures and the processing conditions similar to those of sequence example 1.

For the same reasons as described in sequence example 1, the total thickness of the layers removed from the surfaces of the nozzles 249a and 249b by the wet etching and the dry etching, namely the total etching depth, may be set to fall within a range of, e.g., 15 µm or more and 30 µm or less (specifically, 20 µm or more and 25 µm or less). That is to say, it is advisable that by performing the dry etching, the surfaces of the nozzles 249a and 249b are etched at the depth which falls within a range of, e.g., 15 µm or more and 30 µm or less (specifically, 20 µm or more and 25 µm or less).

For example, in the case where the surfaces of the nozzles 249a and 249b are etched at a depth of 20 µm, it may be possible to wet-etch the surfaces of the nozzles 249a and 249b at a depth of 15 to 19 µm and then to dry-etch the surfaces of the nozzles 249a and 249b at a depth of 1 to 5 µm. For example, it may be possible to wet-etch the surfaces of the nozzles 249a and 249b at a depth of 19.9 µm and then to dry-etch the surfaces of the nozzles 249a and 249b at a depth of 0.1 µm.

As another example, in the case where the surfaces of the nozzles 249a and 249b are etched at a depth of 25 µm, it may be possible to wet-etch the surfaces of the nozzles 249a and 249b at a depth of 20 to 24 µm and then to dry-etch the surfaces of the nozzles 249a and 249b at a depth of 1 to 5 µm. For example, it may be possible to wet-etch the surfaces of the nozzles 249a and 249b at a depth of 24.9 µm and then to dry-etch the surfaces of the nozzles 249a and 249b at a depth of 0.1 µm.

As a further example, in the case where the surfaces of the nozzles 249a and 249b are etched at a depth of 30 µm, it may be possible to wet-etch the surfaces of the nozzles 249a and 249b at a depth of 25 to 29 µm and then to dry-etch the surfaces of the nozzles 249a and 249b at a depth of 1 to 5 µm. For example, it may be possible to wet-etch the surfaces of the nozzles 249a and 249b at a depth of 29.9 µm and then to dry-etch the surfaces of the nozzles 249a and 249b at a depth of 0.1 µm.

Sequence Example 3

As illustrated in FIG. 5C, in this sequence example, the surfaces of the nozzles 249a and 249b are wet-etched at a predetermined depth prior to installing the nozzles 249a and 249b in the process chamber 201. After the wet-etched nozzles 249a and 249b are installed in the process chamber 201 and before the surfaces of the nozzles 249a and 249b are dry-etched, the surfaces of the nozzles 249a and 249b are coated. Thereafter, the surfaces of the nozzles 249a and 249b are dry-etched at a predetermined depth.

The wet etching of the surfaces of the nozzles 249a and 249b can be performed by, for example, the processing procedures and the processing conditions similar to those of sequence example 2.

The coating of the surfaces of the nozzles 249a and 249b can be performed by, for example, the processing procedures and the processing conditions similar to those of the film forming process described above. This coating process may be performed in a state in which an empty boat 217 is loaded into the process chamber 201, namely in a state in which the wafers 200 do not exist in the process chamber 201. Thus, SiOCN film (hereinafter also referred to as a "coating film") having a predetermined film thickness is formed on the outer surfaces of the nozzles 249a and 249b, the surface of the boat 217, the inner wall surface of the reaction tube 203, and so forth. The film thickness of the SiOCN film formed on the outer surfaces of the nozzles 249a and 249b and the like is set to fall within a range of, e.g., 1 nm or more and 200 nm or less, specifically 10 nm or more and 150 nm or less. While the SiOCN film is hardly formed on the inner surfaces of the nozzles 249a and 249b, there may be a case where the SiOCN film is slightly formed on the inner surfaces of the nozzles 249a and 249b due to the unwanted infiltration of a gas into the nozzles 249a and 249b and the remaining of a gas in the nozzles 249a and 249b.

The dry etching of the surfaces of the nozzles 249a and 249b can be performed by, for example, the processing procedures and the processing conditions similar to those of sequence example 1.

By performing the coating of the surfaces of the nozzles 249a and 249b, as described above, the outer surfaces of the nozzles 249a and 249b, the surface of the boat 217 and the inner wall surface of the reaction tube 203 are covered with the coating film. The outer surfaces of the nozzles 249a and 249b, the surface of the boat 217 and the inner wall surface of the reaction tube 203 are protected by the coating film, namely the SiOCN film, when performing the dry etching of the surfaces of the nozzles 249a and 249b. As a consequence, in sequence example 3, the inner surfaces (quartz exposure surfaces) of the nozzles 249a and 249b are preferentially, i.e., selectively dry-etched.

For the same reasons as described in sequence example 1, the total thickness of the layers removed from the inner surfaces of the nozzles 249a and 249b by the wet etching and the dry etching, namely the total etching depth, may be set to fall within a range of, e.g., 15 μm or more and 30 μm or less (specifically, 20 μm or more and 30 μm or less). That is to say, it is advisable that by performing the dry etching, the inner surfaces of the nozzles 249a and 249b are etched at the depth which falls within a range of, e.g., 15 μm or more and 30 μm or less (specifically, 20 μm or more and 30 μm or less).

After the etching process of the surfaces of the nozzles 249a and 249b is completed by the sequences described above, the aforementioned film forming process is started. It is advisable that the aforementioned etching process is performed at least when finally-manufactured, i.e., new, nozzles 249a and 249b are installed in the process chamber 201. However, the aforementioned etching process may not be performed when the nozzles 249a and 249b already subjected to the etching process once or more, namely the reused nozzles 249a and 249b, are re-installed in the process chamber 201.

(4) Effects According to the Present Embodiment

According to the present embodiment, one or more effects set forth below may be achieved.

(a) By etching the surface of the nozzle 249b at a depth which falls within a range of, e.g., 15 μm or more and 30 μm or less from the surface of the nozzle 249b before performing the film forming process, it is possible to avoid the generation of fine particles. As a result, it is possible to improve the quality of the SiOCN film formed on the wafer 200, thereby increasing the substrate processing quality.

(b) The effect (a) mentioned above is equally achievable when only the surface of the nozzle 249b is etched as well as when the surfaces of the nozzles 249b and 249a are etched.

In the case where the surfaces of the nozzles 249a and 249b are etched as in the present embodiment, it is possible to supply the $O_2$ gas or the $NH_3$ gas not only through the nozzle 249b but also through the nozzle 249a. For example, according to the present embodiment, even if the configuration of the gas supply system is changed so that the $O_2$ gas or the $NH_3$ gas is supplied through the nozzle 249a, it is possible to reliably suppress generation of particles. Furthermore, according to the present embodiment, even if, when performing the maintenance of the substrate processing apparatus, any one of the nozzles 249a and 249b is installed in a position where a nozzle for supplying the $O_2$ gas or the $NH_3$ gas is to be installed, it is possible to reliably suppress generation of particles.

(c) The effect (a) mentioned above is equally achievable when only the inner surfaces of the nozzles 249a and 249b are etched as well as when the inner and outer surfaces of the nozzles 249a and 249b are etched.

In order to etch only the inner surfaces of the nozzles 249a and 249b, it is effective that, for example, as in the sequence example illustrated in FIG. 5C, the surfaces of the nozzles 249a and 249b are coated with the SiOCN film prior to dry-etching the surfaces of the nozzles 249a and 249b. In this case, it is possible to suppress the etching of the outer surfaces of the nozzles 249a and 249b, the surface of the boat 217 and the inner wall surface of the reaction tube 203 while preferentially etching the inner surfaces of the nozzles 249a and 249b.

Furthermore, in order to etch only the inner surface of the nozzle 249b, for example, when the dry etching is performed in the respective sequence examples illustrated in FIGS. 5A to 5C, the $F_2$ gas may be supply into only the nozzle 249b and may not be supplied into the nozzle 249a. When performing the dry etching, the etching of the inner surface of the nozzle 249a can be avoided by stopping the supply of the gas into the nozzle 249a or by supplying, for example, the $N_2$ gas into the nozzle 249a. This makes it possible to appropriately reduce the concentration of the $F_2$ gas in the process chamber 201. As a result, it becomes possible to avoid etching damage to the outer surfaces of the nozzles 249a and 249b, the surface of the boat 217 and the inner wall surface of the reaction tube 203.

(d) By performing the etching process using the wet etching and the dry etching in combination as in the sequence examples illustrated in FIGS. 5B and 5C, it is possible to shorten the time required in etching as compared with a case where the etching process is performed by only dry etching. This makes it possible to shorten the down-time of the substrate processing apparatus and to enhance the productivity of the substrate processing apparatus. Furthermore, by shortening the dry etching time, it is possible to avoid over-etching of the surface of the boat 217, the inner wall surface of the reaction tube 203 and the like. In addition, it is possible to reduce the consumption amount of the etching gas, thereby reducing the gas cost, namely the etching process cost.

(e) The aforementioned effects are equally achievable even when an etchant other than the F$_2$ gas is used as the etching gas or even when an etchant other than the HF solution is used as the etching solution. Furthermore, the aforementioned effects are equally achievable even when a gas other than the HCDS gas is used as the precursor gas, a gas other than the C$_3$H$_6$ gas is used as the C-containing gas, a gas other than the O$_2$ gas is used as the O-containing gas, and a gas other than the NH$_3$ gas is used as the H-containing gas.

(5) Modifications

The film forming sequence according to the present embodiment may be modified as in the modifications to be described below.

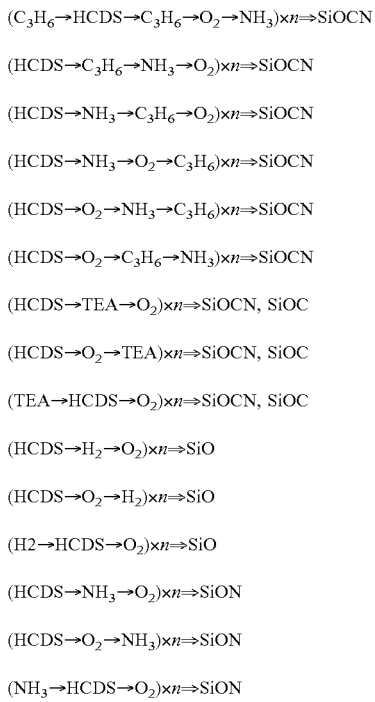

As in these modifications, by arbitrarily selecting and using the reaction gases or by arbitrarily changing the supply order of the precursor gases and the reaction gases, it is possible to change the composition, the composition ratio and the quality of the film as formed. Furthermore, the various kinds of reaction gases may be used by arbitrarily combining them. For example, the C$_3$H$_6$ gas may be added to (mixed with) the NH$_3$ gas, the TEA gas and the HCDS gas. This makes it possible to change the composition, the composition ratio and the quality of the film as formed.

If the silicon-based insulation film formed by the film forming sequence illustrated in FIG. 4 or by the respective modifications described above is used as a sidewall spacer, it is possible to provide a technique of forming a device which is small in leakage current and superior in workability. Furthermore, if the aforementioned silicon-based insulation film is used as an etching stopper, it is possible to provide a technique of forming a device which is superior in workability. According to the film forming sequence illustrated in FIG. 4 or the modifications described above, it is possible to form a silicon-based insulation film having an ideal stoichiometric ratio without having to use plasma. Since the silicon-based insulation film can be formed without having to use plasma, it is possible to adapt the present disclosure to a process for forming, e.g., a SADP film of a DPT, in which plasma damage is about a concern.

In the modifications described above, at the step of supplying the thermally-activated TEA gas to the wafer 200, the supply flow rate of the TEA gas controlled by the MFC 241b is set to fall within a range of, e.g., 100 to 10,000 sccm. The internal pressure of the process chamber 201 is set to fall within a range of, e.g., 1 to 5,000 Pa, specifically 1 to 4,000 Pa. Furthermore, the partial pressure of the TEA gas in the process chamber 201 is set to fall within a range of, e.g., 0.01 to 4,950 Pa. The time period for supplying the TEA gas to the wafer 200, namely the gas supply time (irradiation time), is set to fall within a range of, e.g., 1 to 200 seconds, specifically 1 to 120 seconds, more specifically 1 to 60 seconds. Other processing conditions may be similar to, e.g., the processing conditions of step 4 of the film forming sequence illustrated in FIG. 4. As the N-, C- and H-containing gas, in addition to the TEA gas, it may be possible to use, e.g., an ethylamine-based gas such as a diethylamine ((C$_2$H$_5$)$_2$NH, abbreviation: DEA) gas, a monoethylamine (C$_2$H$_5$NH$_2$, abbreviation: MEA) gas or the like, and a methylamine-based gas such as a trimethylamine ((CH$_3$)$_3$N, abbreviation: TMA) gas, a dimethylamine ((CH$_3$)$_2$NH, abbreviation: DMA) gas, a monomethylamine (CH$_3$NH$_2$, abbreviation: MMA) gas or the like.

The processing procedures and the processing conditions at other steps may be similar to, e.g., the processing procedures and the processing conditions of the respective steps of the film forming sequence illustrated in FIG. 4.

Second Embodiment

In the present embodiment, the supply of the HCDS gas, the O$_2$ gas and the NH$_3$ gas into the process chamber 201 is performed using different nozzles.

Figure 12:
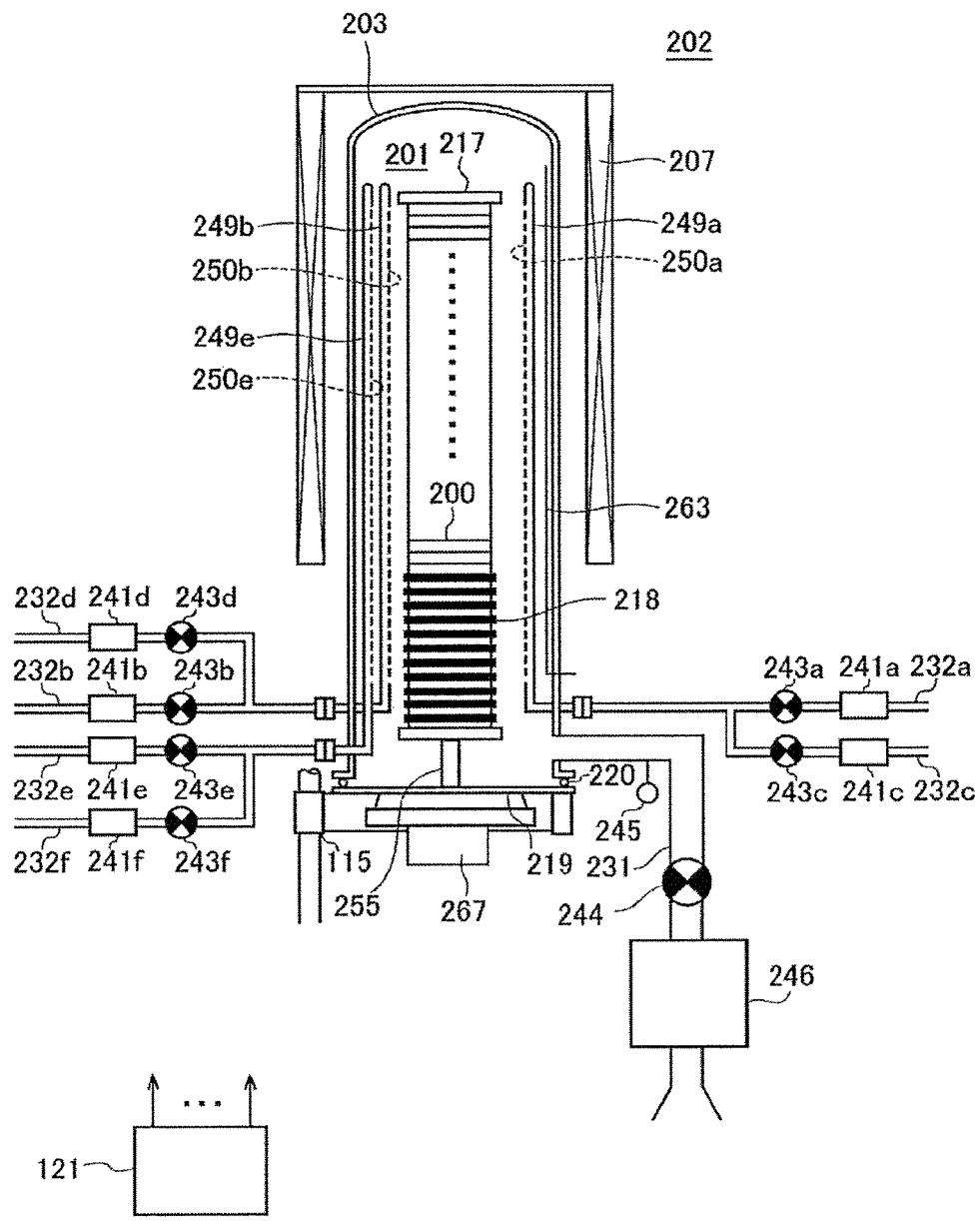
FIG. 12 is a schematic configuration view of a vertical processing furnace of a substrate processing apparatus suitably used in a still further embodiment of the present disclosure, in which a portion of the processing furnace is shown in a vertical cross section.

In FIG. 12, there is illustrated a vertical sectional view of a processing furnace of a substrate processing apparatus used in the present embodiment. In addition to the nozzles 249a and 249b, a nozzle 249e as a third nozzle is further installed in the process chamber 201. Similar to the nozzles 249a and 249b, the nozzle 249e is made of quartz and is provided with gas supply holes 250e. A gas supply pipe 232e is connected to the nozzle 249e. An MFC 241e, which is a flow rate controller (flow rate control part), and a valve 243e, which is an opening/closing valve, are installed in the gas supply pipe 232e sequentially from the upstream side thereof. A gas supply pipe 232f configured to supply an inert gas is connected to the gas supply pipe 232e at the downstream side of the valve 243e. An MFC 241f, which is a flow rate controller (flow rate control part), and a valve 243f, which is an opening/closing valve, are installed in the gas supply pipe 232f sequentially from the upstream side thereof. Other configurations are similar to those of the substrate processing apparatus illustrated in FIG. 1. Elements substantially identical with those described with reference to FIG. 1 are designated by like reference numerals and descriptions thereof are omitted.

Using the substrate processing apparatus illustrated in FIG. 12, a SiOCN film can be formed on the wafer 200 according to the film forming sequence illustrated in FIG. 4. In this case, for example, the supply of the O$_2$ gas into the process chamber 201 is performed through the gas supply pipe 232b and the nozzle 249b. The supply of the NH$_3$ gas into the process chamber 201 is performed through the gas supply pipe 232e and the nozzle 249e. The processing conditions are similar to the processing conditions of the film forming process according to the first embodiment.

Even in the present embodiment, there may be a case where the O$_2$ gas and the NH$_3$ gas are supplied in a mixed state to the surfaces (the inner surfaces and the outer surfaces) of the nozzles 249b and 249e which contain impurities. For example, there may be a case where the $O_2$ gas supplied into the process chamber 201 at step 3 is slightly infiltrated into the nozzle 249e. Furthermore, there may be a case where the $NH_3$ gas supplied into the process chamber 201 at step 4 is slightly infiltrated into the nozzle 249b. In these cases, there may be a case where the $O_2$ gas and the $NH_3$ gas react with each other in the nozzles 249e and 249b to thereby generate a large amount of fine particles near the nozzles 249e and 249b.

Thus, in the present embodiment, similar to the first embodiment, the surfaces of the nozzles 249b and 249e are etched at a depth which falls within a range of 15 μm or more and 30 μm or less (specifically, 20 μm or more and 25 μm or less) from the surface. In this case, the same process as the etching process performed with respect to the nozzle 249b in the first embodiment may be performed with respect to the nozzles 249b and 249e. For example, after the nozzles 249b and 249e are installed in the process chamber 201, the surfaces of the nozzles 249b and 249e may be dry-etched. As another example, the surfaces of the nozzles 249b and 249e may be wet-etched before installing the nozzles 249b and 249e in the process chamber 201, and then the surfaces of the nozzles 249b and 249e may be dry-etched after installing the nozzles 249b and 249e in the process chamber 201. As a further example, the surfaces of the nozzles 249b and 249e may be coated after installing the wet-etched nozzles 249b and 249e in the process chamber 201 and before dry-etching the surfaces of the nozzles 249b and 249e. The processing conditions used at this time are similar to the processing conditions of the etching process described in the first embodiment. This makes it possible to achieve the same effects as achieved in the first embodiment.

Third Embodiment

In the present embodiment, the substrate processing apparatus illustrated in FIG. 1 is used. When performing the film forming sequence illustrated in FIG. 4, the supply of the HCDS gas into the process chamber 201 and the supply of the $NH_3$ gas into the process chamber 201 are respectively performed through the nozzle 249a. Furthermore, the supply of the $O_2$ gas into the process chamber 201 is performed through the nozzle 249b.

Even in the present embodiment, for the same reasons as described in the second embodiment, there may be a case where a large amount of fine particles are generated near the nozzles 249a and 249b. Thus, in the present embodiment, similar to the first embodiment, the surfaces of the nozzles 249a and 249b are etched at a depth which falls within a range of 15 μm or more and 30 μm or less (specifically, 20 μm or more and 25 μm or less) from the surface. In this case, the same process as the etching process performed with respect to the nozzles 249a and 249b in the first embodiment may be performed. The processing conditions used at this time are similar to the processing conditions of the etching process described in the first embodiment. This makes it possible to achieve the same effects as achieved in the first embodiment.

Other Embodiments of the Present Disclosure

While some embodiments of the present disclosure have been specifically described above, the present disclosure is not limited to the aforementioned embodiments but may be differently modified without departing from the subject matter of the present disclosure.

For example, in the first embodiment, there has been described an example in which when dry-etching the surface of the nozzle 249b, the $F_2$ gas is supplied into the process chamber 201 through the nozzles 249a and 249b. However, the method of dry-etching the surface of the nozzle 249b is not limited to this example.

That is to say, as described above, when dry-etching the surface of the nozzle 249b, the supply of the $F_2$ gas into the nozzle 249a may not be performed and the $F_2$ gas may be supplied into the process chamber 201 only through the nozzle 249b. At this time, for example, an $N_2$ gas may be supplied into the nozzle 249a. In this case, it is possible to reduce the etching amount of the inner surface of the nozzle 249a or not to perform the etching of the inner surface of the nozzle 249a.

Furthermore, when dry-etching the surface of the nozzle 249b, a first etching gas, for example, a $F_2$ gas, may be supplied into the process chamber 201 through the nozzle 249b, and a second etching gas (additive gas) having a molecular structure (chemical structure) differing from that of the first etching gas, for example, a hydrogen fluoride (HF) gas or a nitric monoxide (NO) gas, may be supplied into the process chamber 201 through the nozzle 249a. In this case, it is possible to reduce the etching amount of the inner surface of the nozzle 249a or not to perform the etching of the inner surface of the nozzle 249a. Furthermore, by adding the HF gas, the NO gas or the like to the $F_2$ gas, it is possible to increase the etching power of the $F_2$ gas in the process chamber 201. Moreover, the dry-etching can be performed by supplying the $F_2$ gas into the process chamber 201 through the nozzle 249a and by supplying the HF gas or the NO gas into the process chamber 201 through the nozzle 249b.

In addition, when dry-etching the surface of the nozzle 249b, a step of supplying the $F_2$ gas into the process chamber 201 through the nozzle 249a and supplying the NO gas or the HF gas into the process chamber 201 through the nozzle 249b and a step of supplying the HF gas or the NO gas into the process chamber 201 through the nozzle 249a and supplying the $F_2$ gas into the process chamber 201 through the nozzle 249b may be alternately performed a predetermined number of times (once or more). In this case, it is possible to uniformly etch the inner surfaces of the nozzles 249a and 249b.

The film forming sequences described in the aforementioned embodiments may be suitably applied to a case where an oxide film containing a metal element such as titanium (Ti), zirconium (Zr), hafnium (Hf), tantalum (Ta), niobium (Nb), aluminum (Al), molybdenum (Mo), tungsten (W) or the like, namely a metal-based oxide film, is formed on the wafer 200. That is to say, the aforementioned film forming sequences may be suitably applied to a case where a TiOCN film, a TiOC film, a TiON film, a TiO film, a ZrOCN film, a ZrOC film, a ZrON film, a ZrO film, an HfOCN film, an HfOC film, an HfON film, an HfO film, a TaOCN film, a TaOC film, a TaON film, a TaO film, an NbOCN film, an NbOC film, an NbON film, an NbO film, an AlOCN film, an AlOC film, an AlON film, an AlO film, an MoOCN film, an MoOC film, an MoON film, an MoO film, a WOCN film, a WOC film, a WON film, or a WO film is formed on the wafer 200.

In the case of forming the metal-based oxide film, as the precursor gas, it may be possible to use, e.g., an inorganic metal precursor gas containing a metal element and a halogen element, such as a titanium tetrachloride ($TiCl_4$)

gas, a titanium tetrafluoride (TiF$_4$) gas, a zirconium tetrachloride (ZrCl$_4$) gas, a zirconium tetrafluoride (ZrF$_4$) gas, a hafnium tetrachloride (HfCl$_4$) gas, a hafnium tetrafluoride (HfF$_4$) gas, a tantalum pentachloride (TaCl$_5$) gas, a tantalum pentafluoride (TaF$_5$) gas, a niobium pentachloride (NbCl$_5$) gas, a niobium pentafluoride (NbF$_5$) gas, an aluminum trichloride (AlCl$_3$) gas, an aluminum trifluoride (AlF$_3$) gas, a molybdenum pentachloride (MoCl$_5$) gas, a molybdenum pentafluoride (MoF$_5$) gas, a tungsten hexachloride (WCl$_6$) gas, a tungsten hexafluoride (WF$_6$) gas, or the like. Furthermore, as the precursor gas, it may be possible to use, e.g., an organic metal precursor gas containing a metal element and carbon, such as a trimethyl aluminum (Al(CH$_3$)$_3$, abbreviation: TMA) gas or the like. As the reaction gases, it may be possible to use gases similar to those used in the aforementioned embodiments.

For example, a TiON film or a TiO film may be formed on the wafer 200 by the film forming sequences illustrated below.

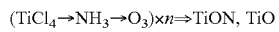

(TiCl$_4$→NH$_3$→O$_3$)×n⇒TiON, TiO

(TiCl$_4$→O$_3$→NH$_3$)×n⇒TiON, TiO

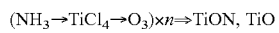

(NH$_3$→TiCl$_4$→O$_3$)×n⇒TiON, TiO

That is to say, the present disclosure may be suitably applied to a case where a film containing a predetermined element such as a semiconductor element, a metal element or the like is formed. Even in the case of performing this film forming process, it may be possible to perform the film forming process under processing conditions similar to those of the aforementioned embodiments. The same effects as those of the aforementioned embodiments are achieved.

Recipes (programs describing processing procedures and processing conditions) used in etching or substrate processing may be prepared individually according to the processing contents (the nozzle etching amount and the kind, composition ratio, quality, film thickness, processing procedure and processing condition of the film to be formed on the substrate) and may be stored in the memory device 121c via a telecommunication line or the external memory device 123. Moreover, at the start of various kinds of processing, the CPU 121a may properly select an appropriate recipe from the recipes stored in the memory device 121c according to the processing contents. Thus, it is possible to accurately perform the nozzle etching process with enhanced reproducibility. It is also possible for a single substrate processing apparatus to form films of different kinds, composition ratios, qualities and thicknesses with enhanced reproducibility. In addition, it is possible to reduce an operator's burden (e.g., a burden borne by an operator when inputting processing procedures and processing conditions) and to quickly start the etching or the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using a substrate processing apparatus provided with a hot-wall-type processing furnace. The present disclosure is not limited to the aforementioned embodiments but may be appropriately applied to a case where films are formed using a substrate processing apparatus provided with a cold-wall-type processing furnace.

Figure 11A:
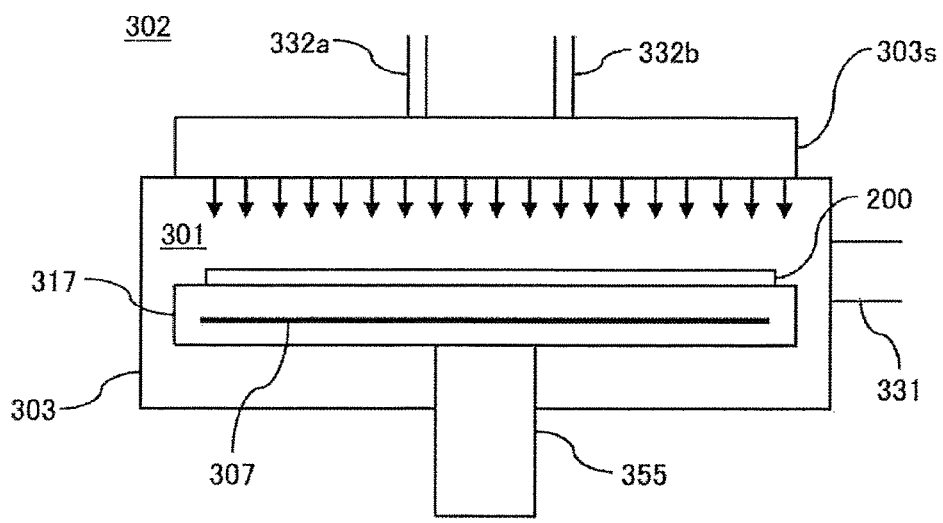
FIG. 11A is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 11A. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332a configured to supply the aforementioned precursor gas and a gas supply port 332b configured to the supply the aforementioned reaction gas and made of quartz are connected to inlets (gas introduction holes) of the shower head 303s. A gas supply system similar to the precursor gas supply system of the aforementioned embodiment is connected to the gas supply port 332a. A gas supply system similar to the reaction gas supply systems of the aforementioned embodiments is connected to the gas supply port 332b. A gas distribution plate configured to supply a gas into the process chamber 301 in a shower-like manner is installed in outlets (gas discharge holes) of the shower head 303s. The shower head 303s is installed at such a position as to face the surfaces of the wafers 200 carried into the process chamber 301. An exhaust port 331 configured to evacuate the interior of the process chamber 301 is installed in the process vessel 303. An exhaust system similar to the exhaust systems of the aforementioned embodiments is connected to the exhaust port 331.

Figure 11B:
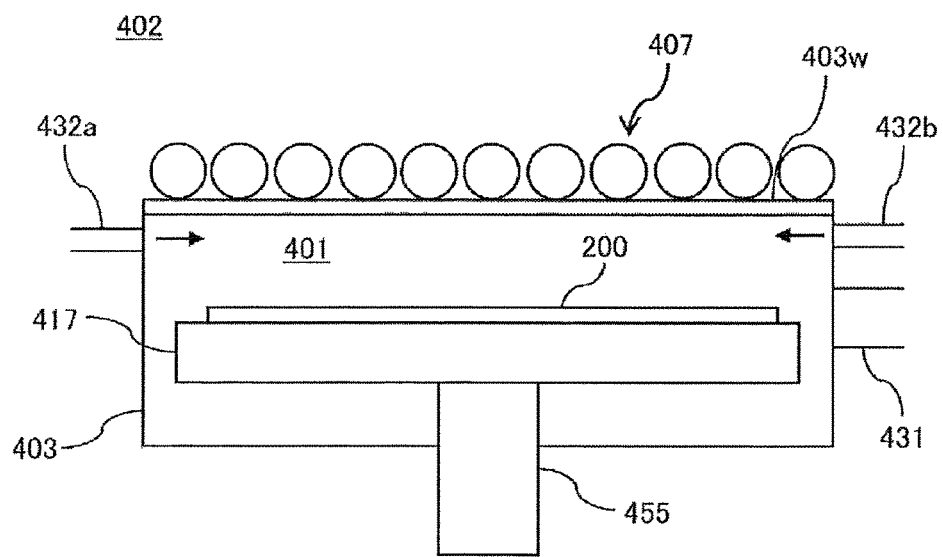
FIG. 11B is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 11B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. A gas supply port 432a configured to supply the aforementioned precursor gas and a gas supply port 432b as a gas supply part configured to supply the aforementioned reaction gas and made of quartz are connected to the process vessel 403. A gas supply system similar to the precursor gas supply systems of the aforementioned embodiments is connected to the gas supply port 432a. A gas supply system similar to the reaction gas supply systems of the aforementioned embodiments is connected to the gas supply port 432b. The gas supply ports 432a and 432b are respectively installed at the lateral side of the end portions of the wafers 200 carried into the process chamber 401, namely at such positions as not to face the surfaces of the wafers 200 carried into the process chamber 401. An exhaust port 431 configured to evacuate the interior of the process chamber 401 is installed in the process vessel 403. An exhaust system similar to the exhaust systems of the aforementioned embodiments is connected to the exhaust port 431.

In the case of using these substrate processing apparatuses, film formation may be performed by the sequences and processing conditions similar to those of the embodiments and modifications described above. Effects similar to those of the embodiments and modifications described above may be achieved.

The embodiments and modifications described above may be appropriately combined with one another. In addition, the processing conditions used at this time may be similar to, e.g., the processing conditions of the embodiments and modifications described above.

EXAMPLE

Descriptions will now be made on the results of tests conducted by the present inventors in connection with the aforementioned embodiments.

As sample 1, SiOCN films were formed on a plurality of wafers by the film forming sequence illustrated in FIG. 4, using the substrate processing apparatus illustrated in FIG. 1. A HCDS gas was used as the precursor gas. A $C_3H_6$ gas was used as the C-containing gas. An $O_2$ gas was used as the O-containing gas. An $NH_3$ gas was used as the H-containing gas. The film forming temperature was set at a predetermined temperature which falls within a range of 600 to 620 degrees C. The etching of the surface of the nozzle which supplies the $O_2$ gas or the $NH_3$ gas was not performed. Other processing conditions were set to fall within a range of the processing conditions described in the first embodiment.

As sample 2, SiOCN films were formed on a plurality of wafers by the film forming sequence illustrated in FIG. 4, using the substrate processing apparatus illustrated in FIG. 1. A HCDS gas was used as the precursor gas. A $C_3H_6$ gas was used as the C-containing gas. An $O_2$ gas was used as the O-containing gas. An $NH_3$ gas was used as the H-containing gas. The film forming temperature was set at a predetermined temperature which falls within a range of 575 to 595 degrees C. The etching of the surface of the nozzle which supplies the $O_2$ gas or the $NH_3$ gas was not performed. Other processing conditions were similar to the processing conditions used when manufacturing sample 1.

As sample 3, SiOCN films were formed on a plurality of wafers by the film forming sequence illustrated in FIG. 4, using the substrate processing apparatus illustrated in FIG. 1. A HCDS gas was used as the precursor gas. A $C_3H_6$ gas was used as the C-containing gas. An $O_2$ gas was used as the O-containing gas. An $NH_3$ gas was used as the H-containing gas. The film forming temperature was set at a predetermined temperature which falls within a range of 550 to 570 degrees C. The etching of the surface of the nozzle which supplies the $O_2$ gas or the $NH_3$ gas was not performed. Other processing conditions were similar to the processing conditions used when manufacturing sample 1.

Figures 10A, 10B:
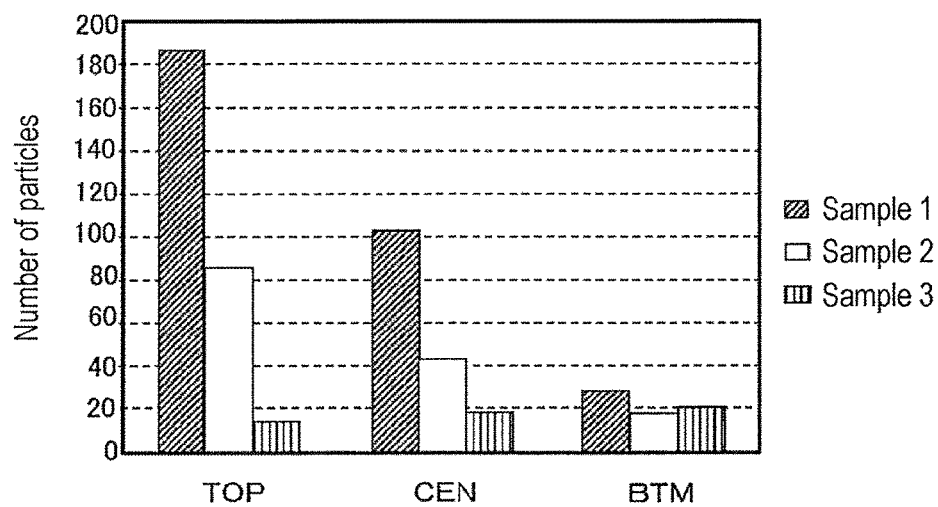
FIG. 10A is a diagram illustrating evaluation results on the number of particles when a film forming temperature is changed.
FIG. 10B is a diagram illustrating evaluation results on the number of particles when a nozzle etching process is not performed and when a nozzle etching process is performed.

The numbers of particles adhering to the surfaces of the wafers (the surfaces of the SiOCN films) of samples 1 to 3 were measured in the top portion (TOP), the central portion (CEN) and the bottom portion (BTM) of the wafer arrangement region. FIG. 10A is a view showing the measurement results of the numbers of particles. The vertical axis in FIG. 10A indicates the number of particles having a diameter of 45 nm or more, and the horizontal axis in FIG. 10A indicates the positions (TOP, CEN and BTM) of the wafers to be measured. According to FIG. 10A, it can be noted that in sample 3 manufactured by setting the film forming temperature to fall within a range of 550 to 570 degrees C., the number of particles is 20 or less in any of the positions TOP, CEN and BTM and further that the SiOCN films formed as sample 3 sufficiently comply with the requirements as products. Furthermore, according to FIG. 10A, it can be noted that the number of particles increases as the film forming temperature becomes higher, and further that the SiOCN films formed as samples 1 and 2 do not comply with the requirements as products. According to the evaluation results illustrated in FIG. 10A, it can be appreciated that the technical significance of performing the nozzle etching process prior to performing the film forming process becomes higher when the film forming temperature is set at a temperature of 575 degrees C. or more.

Subsequently, as sample 4, SiOCN films were formed on a plurality of wafers by the film forming sequence illustrated in FIG. 4, using the substrate processing apparatus illustrated in FIG. 1. A HCDS gas was used as the precursor gas. A $C_3H_6$ gas was used as the C-containing gas. An $O_2$ gas was used as the O-containing gas. An $NH_3$ gas was used as the H-containing gas. The etching of the surface of the nozzle which supplies the $O_2$ gas or the $NH_3$ gas was not performed. The processing conditions of the film forming process were set to fall within the range of the processing conditions described in the first embodiment.

In addition, as sample 5, SiOCN films were formed on a plurality of wafers by the film forming sequence illustrated in FIG. 4, using the substrate processing apparatus illustrated in FIG. 1. A HCDS gas was used as the precursor gas. A $C_3H_6$ gas was used as the C-containing gas. An $O_2$ gas was used as the O-containing gas. An $NH_3$ gas was used as the H-containing gas. Prior to performing the film forming process, the etching of the surface of the nozzle which supplies the $O_2$ gas or the $NH_3$ gas was performed according to the sequence illustrated in FIG. 5B. An HF solution was used as the etching solution and a $F_2$ gas used as the etching gas. The etching was performed up to a depth of 20 μm from the surface. The processing conditions of the etching process were set to fall within the range of the processing conditions described in the first embodiment. The processing conditions of the film forming process were similar to the processing conditions used when manufacturing sample 4. The etching of the surface of the nozzle which supplies the HCDS gas or the $C_3H_6$ gas was not performed.

The numbers of particles adhering to the wafers of samples 4 and 5 were measured in the top portion (TOP), the central portion (CEN) and the bottom portion (BTM) of the wafer arrangement region. As a result, in the wafer of sample 4 manufactured by not performing the etching of the nozzle, the numbers of particles having a diameter of 45 μm or more measured in the positions TOP, CEN and BTM were 1,261, 396 and 248, respectively. Furthermore, in the wafer of sample 5 manufactured by performing the etching of the nozzle, the numbers of particles having a diameter of 45 μm or more measured in the positions TOP, CEN and BTM were 36, 32 and 18, respectively. That is to say, it can be noted that if the etching of the surface of the nozzle which supplies the $O_2$ gas or the $NH_3$ gas is performed according to the methods described in the aforementioned embodiments before performing the film forming process, it is possible to significantly reduce the number of particles adhering to the wafer.

<Aspects of Present Disclosure>

Hereinafter, some aspects of the present disclosure will be supplemented.

(Supplementary Note 1)

According to one aspect of the present disclosure, there is provided a method of manufacturing a semiconductor device or a substrate processing method, including: forming a film on a substrate by performing a cycle a predetermined number of times (once or more), the cycle including non-simultaneously performing:

supplying a precursor gas to the substrate in a process chamber through a first nozzle;

supplying an oxygen-containing gas to the substrate in the process chamber through a second nozzle made of quartz and differing from the first nozzle; and supplying a hydrogen-containing gas to the substrate in the process chamber through the second nozzle, wherein the method further includes: prior to performing the act of forming the film, etching a surface of the second nozzle to a depth which falls within a range of 15 μm or more and 30 μm or less (specifically, 20 μm or more and 25 μm or less) from the surface of the second nozzle.

(Supplementary Note 2)

In the method of Supplementary Note 1, the act of etching the surface of the second nozzle may include dry-etching the surface of the second nozzle after the second nozzle is installed in the process chamber.

(Supplementary Note 3)

In the method of Supplementary Note 2, in the act of dry-etching the surface of the second nozzle, an etching gas may be supplied into the process chamber through the second nozzle. At this time, the etching gas may be supplied into the process chamber through the first nozzle and the second nozzle.

(Supplementary Note 4)

In the method of Supplementary Note 2, in the act of dry-etching the surface of the second nozzle, a first etching gas may be supplied into the process chamber through one of the first nozzle and the second nozzle and a second etching gas having a molecular structure (chemical structure) differing from a molecular structure (chemical structure) of the first etching gas may be supplied into the process chamber through the other nozzle differing from the one of the first nozzle and the second nozzle.

(Supplementary Note 5)

In the method of Supplementary Note 2, in the act of dry-etching the surface of the second nozzle, supplying a first etching gas into the process chamber through one of the first nozzle and the second nozzle while supplying a second etching gas having a molecular structure differing from a molecular structure of the first etching gas into the process chamber through the other nozzle differing from the one of the first nozzle and the second nozzle, and supplying the second etching gas into the process chamber through the one of the first nozzle and the second nozzle while supplying the first etching gas into the process chamber through the other nozzle, may be alternately performed a predetermined number of times (once or more).

(Supplementary Note 6)

In the method of any one of Supplementary Notes 1 to 5, the act of etching the surface of the second nozzle may include wet-etching the surface of the second nozzle before the second nozzle is installed in the process chamber.

(Supplementary Note 7)

In the method of Supplementary Note 6, in the act of wet-etching the surface of the second nozzle, the second nozzle may be immersed in an etching solution.

(Supplementary Note 8)

In the method of any one of Supplementary Notes 1 to 7, the act of etching the surface of the second nozzle may include coating the surface of the second nozzle after installing the second nozzle in the process chamber and before dry-etching the surface of the second nozzle.

(Supplementary Note 9)

In the method of Supplementary Note 8, the act of coating the surface of the second nozzle includes performing a cycle a predetermined number of times (once or more), the cycle including non-simultaneously performing: supplying the precursor gas into the process chamber through the first nozzle, supplying the oxygen-containing gas into the process chamber through the second nozzle, and supplying the hydrogen-containing gas into the process chamber through the second nozzle. More specifically, the cycle may be performed a predetermined number of times in a state in which the substrate does not exist in the process chamber.

(Supplementary Note 10)

In the method of any one of Supplementary Notes 1 to 9, in the act of etching the surface of the second nozzle, an inner surface (an inner circumferential surface or an inner wall surface) of the second nozzle may be etched.

(Supplementary Note 11)

In the method of any one of Supplementary Notes 1 to 10, in the act of etching the surface of the second nozzle, an outer surface (an outer circumferential surface or an outer wall surface) of the second nozzle may be etched.

(Supplementary Note 12)

In the method of any one of Supplementary Notes 1 to 11, in the act of etching the surface of the second nozzle, at least an outer surface of the first nozzle may be etched.

(Supplementary Note 13)

According to another aspect of the present disclosure, there is provided a method of manufacturing a semiconductor device or a substrate processing method, including: forming a film on a substrate by performing a cycle a predetermined number of times, the cycle including non-simultaneously performing:

supplying a precursor gas to the substrate in a process chamber through a first nozzle;

supplying an oxygen-containing gas to the substrate in the process chamber through a second nozzle made of quartz and differing from the first nozzle; and supplying a hydrogen-containing gas to the substrate in the process chamber through a third nozzle made of quartz and differing from the first nozzle and the second nozzle, wherein the method further includes: prior to performing the act of forming the film, etching a surface of the second nozzle and a surface of the third nozzle to a depth which falls within a range of 15 μm or more and 30 μm or less (specifically, 20 μm or more and 25 μm or less) from the surface.

(Supplementary Note 14)

According to another aspect of the present disclosure, there is provided a method of manufacturing a semiconductor device or a substrate processing method, including: forming a film on a substrate by performing a cycle a predetermined number of times, the cycle including non-simultaneously performing:

supplying a precursor gas to the substrate in a process chamber through a first nozzle made of quartz;

supplying one of an oxygen-containing gas and a hydrogen-containing gas to the substrate in the process chamber through a second nozzle made of quartz and differing from the first nozzle; and supplying the other gas differing from one of the oxygen-containing gas and the hydrogen-containing gas to the substrate in the process chamber through the first nozzle, wherein the method further includes: prior to performing the act of forming the film, etching a surface of the first nozzle and a surface of the second nozzle at a depth which falls within a range of 15 μm or more and 30 μm or less (specifically, 20 μm or more and 25 μm or less) from the surface.

(Supplementary Note 15)

In the method of any one of Supplementary Notes 1 to 14, the hydrogen-containing gas may be a gas containing nitrogen and hydrogen.

(Supplementary Note 16)

In the method of any one of Supplementary Notes 1 to 15, the cycle may further include supplying a carbon-containing gas to the substrate in the process chamber. More specifically, the cycle may further include performing: the act of supplying the carbon-containing gas non-simultaneously with the respective acts.

(Supplementary Note 17)

According to another aspect of the present disclosure, there is provided a substrate processing apparatus, including:

a process chamber configured to accommodate a substrate;

a precursor gas supply system configured to supply a precursor gas to the substrate in the process chamber through a first nozzle;

an oxygen-containing gas supply system configured to supply an oxygen-containing gas to the substrate in the process chamber through a second nozzle made of quartz and differing from the first nozzle;

a hydrogen-containing gas supply system configured to supply a hydrogen-containing gas to the substrate in the process chamber through the second nozzle;

an etching gas supply system configured to supply an etching gas into the process chamber; and a control part configured to control the precursor gas supply system, the oxygen-containing gas supply system, the hydrogen-containing gas supply system and the etching gas supply system so that a process of forming a film on the substrate by performing a cycle a predetermined number of times is performed, the cycle including non-simultaneously performing: supplying the precursor gas to the substrate in the process chamber; supplying the oxygen-containing gas to the substrate in the process chamber; and supplying the hydrogen-containing gas to the substrate in the process chamber, and so that prior to performing the process of forming the film, the etching gas is supplied into the process chamber to etch a surface of the second nozzle to a depth which falls within a range of 15 μm or more and 30 μm or less (specifically, 20 μm or more and 25 μm or less) from the surface of the second nozzle.

(Supplementary Note 18)

According to another aspect of the present disclosure, there is provided a program or a non-transitory computer-readable recording medium storing the program, wherein the program is configured to cause a computer to perform a process of forming a film on a substrate by performing a cycle a predetermined number of times, the cycle including non-simultaneously performing:

supplying a precursor gas to the substrate in a process chamber through a first nozzle;

supplying an oxygen-containing gas to the substrate in the process chamber through a second nozzle made of quartz and differing from the first nozzle; and supplying a hydrogen-containing gas to the substrate in the process chamber through the second nozzle, wherein prior to causing the computer to performing the act of forming the film, the computer is caused to further perform a process of etching a surface of the second nozzle to a depth which falls within a range of 15 μm or more and 30 μm or less (specifically, 20 μm or more and 25 μm or less) from the surface of the second nozzle.

According to the present disclosure in some embodiments, it is possible to suppress generation of particles when forming a film on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising: forming a film on a substrate by performing a cycle a predetermined number of times, the cycle including non-simultaneously performing:

supplying a precursor gas to the substrate in a process chamber through a first nozzle;

supplying an oxygen-containing gas to the substrate in the process chamber through a second nozzle made of quartz and differing from the first nozzle; and supplying a hydrogen-containing gas to the substrate in the process chamber through the second nozzle, wherein the method further comprises: prior to performing the act of forming the film, etching a surface of the second nozzle to a depth which falls within a range of 15 μm or more and 30 μm or less from the surface of the second nozzle.

2. The method of claim 1, wherein in the act of etching the surface of the second nozzle, an inner surface of the second nozzle is etched.

3. The method of claim 1, wherein in the act of etching the surface of the second nozzle, an outer surface of the second nozzle is etched.

4. The method of claim 1, wherein in the act of etching the surface of the second nozzle, at least an outer surface of the first nozzle is etched.

5. The method of claim 1, wherein the hydrogen-containing gas is a gas including nitrogen and hydrogen.

6. The method of claim 1, wherein the act of etching the surface of the second nozzle includes wet-etching the surface of the second nozzle before the second nozzle is installed in the process chamber.

7. The method of claim 6, wherein in the act of wet-etching the surface of the second nozzle, the second nozzle is immersed in an etching solution.

8. The method of claim 1, wherein the cycle further includes supplying a carbon-containing gas to the substrate in the process chamber.

9. The method of claim 8, wherein the act of supplying the carbon-containing gas is non-simultaneously performed with the acts of supplying the precursor gas, supplying the oxygen-containing gas and supplying the hydrogen-containing gas.

10. The method of claim 1, wherein the act of etching the surface of the second nozzle includes dry-etching the surface of the second nozzle after the second nozzle is installed in the process chamber.

11. The method of claim 10, wherein in the act of dry-etching the surface of the second nozzle, an etching gas is supplied into the process chamber through the second nozzle.

12. The method of claim 10, wherein in the act of dry-etching the surface of the second nozzle, a first etching gas is supplied into the process chamber through one of the first nozzle and the second nozzle and a second etching gas having a molecular structure differing from a molecular structure of the first etching gas is supplied into the process chamber through the other nozzle differing from the one of the first nozzle and the second nozzle.

13. The method of claim 10, wherein in the act of dry-etching the surface of the second nozzle, supplying a first etching gas into the process chamber through one of the first nozzle and the second nozzle while supplying a second etching gas having a molecular structure differing from a molecular structure of the first etching gas into the process chamber through the other nozzle differing from the one of the first nozzle and the second nozzle, and supplying the second etching gas into the process chamber through the one of the first nozzle and the second nozzle while supplying the first etching gas into the process chamber through the other nozzle, are alternately performed a predetermined number of times.

14. The method of claim 10, wherein the act of etching the surface of the second nozzle includes coating the surface of the second nozzle after installing the second nozzle in the process chamber and before dry-etching the surface of the second nozzle.

15. The method of claim 14, wherein the act of coating the surface of the second nozzle includes performing a cycle a predetermined number of times, the cycle including non-simultaneously performing:
- supplying the precursor gas into the process chamber through the first nozzle,
- supplying the oxygen-containing gas into the process chamber through the second nozzle, and
- supplying the hydrogen-containing gas into the process chamber through the second nozzle.

* * * * *